United States Patent
Tsuchiyama et al.

(10) Patent No.: US 10,886,695 B2
(45) Date of Patent: Jan. 5, 2021

(54) SEMICONDUCTOR DEVICE

(71) Applicant: RENESAS ELECTRONICS CORPORATION, Tokyo (JP)

(72) Inventors: Kazuaki Tsuchiyama, Tokyo (JP); Motoo Suwa, Tokyo (JP); Hidemasa Takahashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/544,363

(22) Filed: Aug. 19, 2019

(65) Prior Publication Data
US 2020/0083663 A1 Mar. 12, 2020

(30) Foreign Application Priority Data
Sep. 12, 2018 (JP) .................... 2018-170389

(51) Int. Cl.
*H01S 5/00* (2006.01)
*H01S 5/022* (2006.01)
*H01S 5/042* (2006.01)

(52) U.S. Cl.
CPC ...... *H01S 5/02244* (2013.01); *H01S 5/02212* (2013.01); *H01S 5/02248* (2013.01); *H01S 5/02276* (2013.01); *H01S 5/0427* (2013.01)

(58) Field of Classification Search
CPC ............. H01S 5/02248; H01S 5/0427; H01S 5/02212; H01S 5/02276; H01S 5/02244
See application file for complete search history.

(56) References Cited

U.S. PATENT DOCUMENTS

| | | | |
|---|---|---|---|
| 7,056,036 B2 | 6/2006 | Keh et al. | |
| 10,347,567 B2* | 7/2019 | Nishikizawa | ....... H01L 21/4825 |
| 2004/0126066 A1* | 7/2004 | Keh | ........ G02B 6/4201 385/92 |
| 2010/0329296 A1* | 12/2010 | Hata | ....... H01S 5/405 372/50.12 |
| 2013/0049137 A1* | 2/2013 | Uno | ....... H02M 1/32 257/401 |
| 2015/0187682 A1* | 7/2015 | Imura | ....... H01L 23/49575 257/676 |

FOREIGN PATENT DOCUMENTS

JP          2004-214651 A         7/2004

* cited by examiner

*Primary Examiner* — Kinam Park
(74) *Attorney, Agent, or Firm* — McDermott Will & Emery LLP

(57) ABSTRACT

Improve semiconductor device performance. The wiring WL1A on which the semiconductor chip CHP1 in which the semiconductor lasers LD is formed is mounted has a stub STB2 in the vicinity of the mounting area of the semiconductor chip CHP1.

15 Claims, 30 Drawing Sheets

FIG. 1
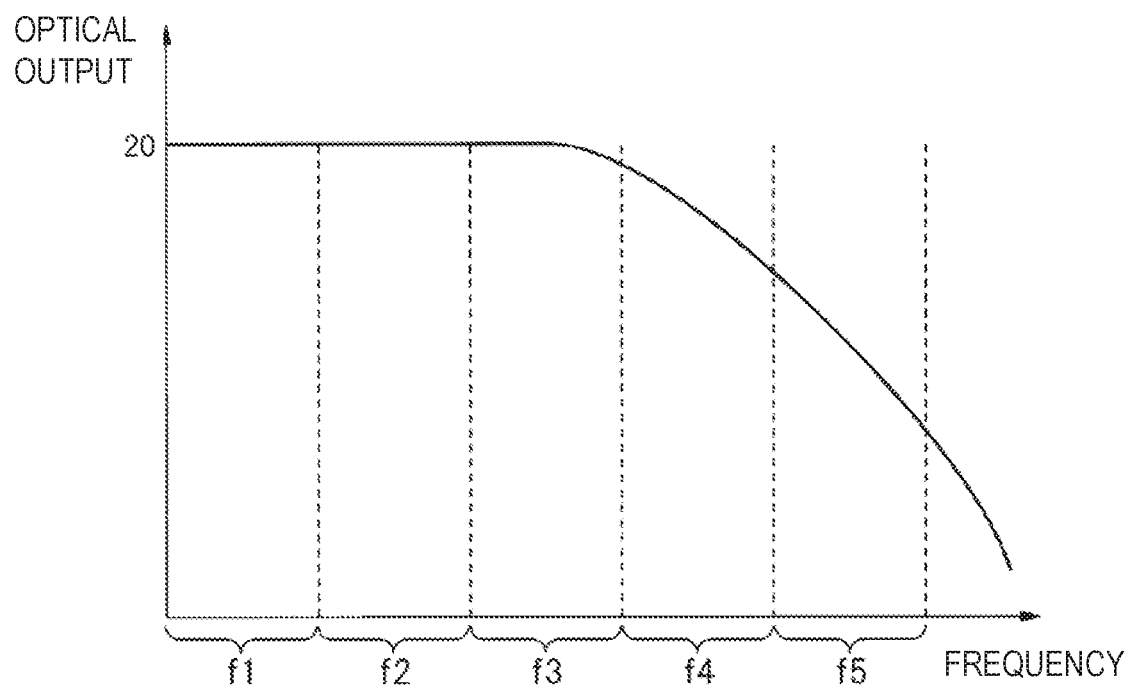
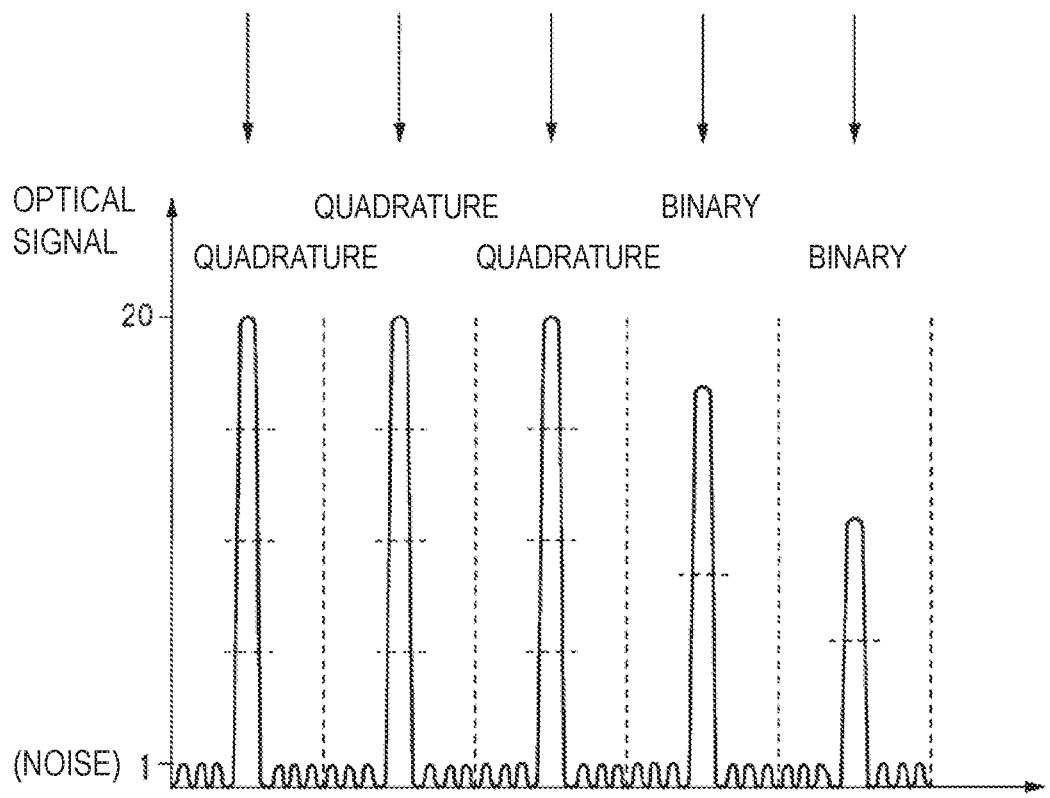

FIG. 3
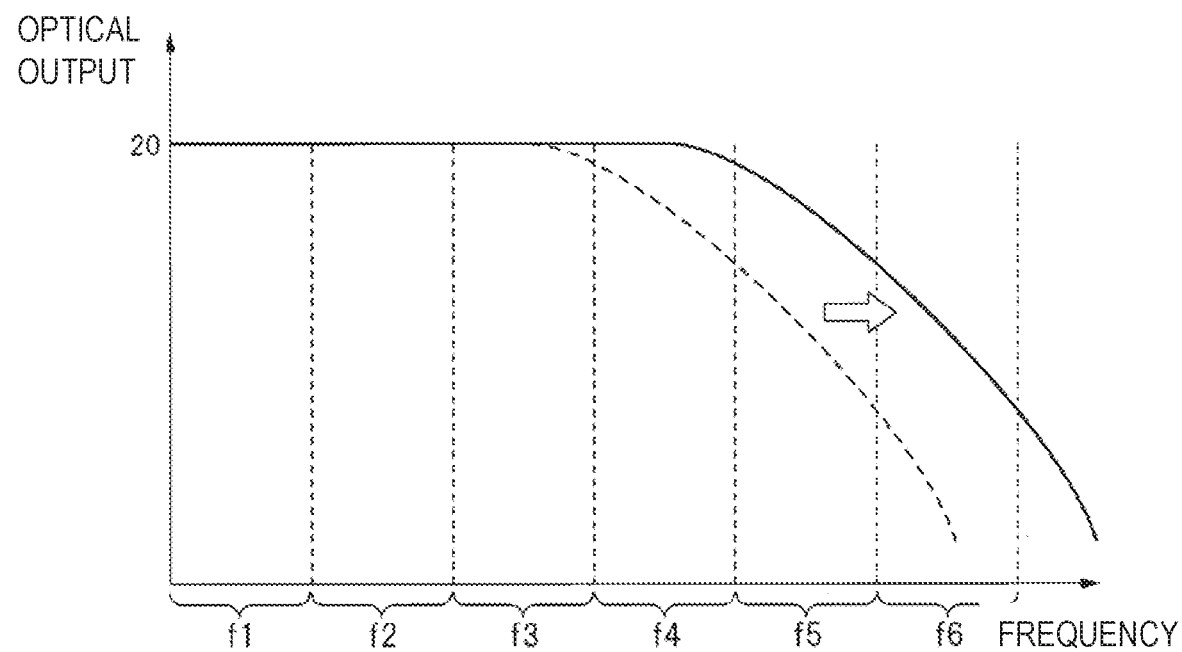
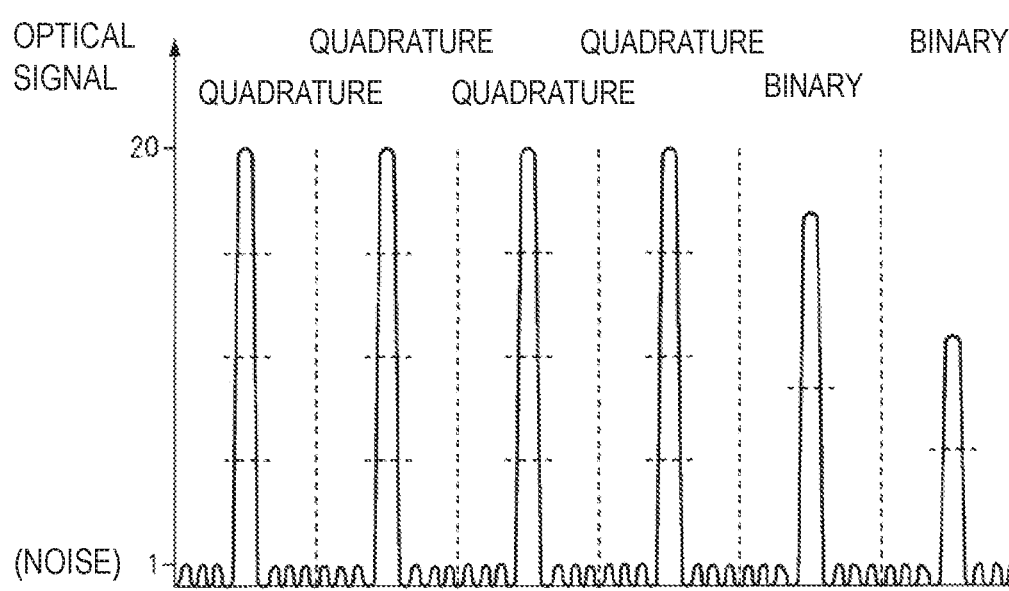

SEMICONDUCTOR DEVICE

CROSS-REFERENCE TO RELATED APPLICATIONS

The disclosure of Japanese Patent Application No. 2018-170389 filed on Sep. 12, 2018 including the specification, drawings and abstract is incorporated herein by reference in its entirety.

BACKGROUND

The present disclosure relates to a semiconductor device and, for example, to a technique useful for application to a semiconductor device including a compact optical device (TOSA: transmitter optical sub assembly) for use in optical transceivers.

Japanese Patent Application Laid-Open No. 2004-214651 describes a technique relating to an optical module including a semiconductor chip in which a semiconductor laser is formed.

SUMMARY

In order to realize high-speed optical communication in an optical transmission system, it is important to improve the data rate of a small optical device for transmission used in an optical transceiver. In particular, the data rates of DMT (Discrete multi-tone) optical transceivers are greatly affected by the frequency characteristics of optical outputs in small optical devices for transmitting. Therefore, in order to improve the data rate of the optical transceiver of the DMT system, it is desired to improve the frequency characteristic of the optical output in the small optical device for transmission.

Other objects and novel features will become apparent from the description of this specification and the accompanying drawings.

In the semiconductor device according to the embodiment, in a wiring on which a semiconductor chip is mounted, a stub is provided in the vicinity of the mounting area of the semiconductor chip in which a semiconductor laser is formed.

According to one embodiment, the performance of the semiconductor device can be improved.

BRIEF DESCRIPTION OF THE DRAWINGS

FIG. 1 is a graph showing the relationship between the optical output and the frequency of a semiconductor laser included in a small optical device for transmission.

FIG. 3 is a diagram schematically illustrating a first method of improving "GB product."

DETAILED DESCRIPTION

Figure 2:
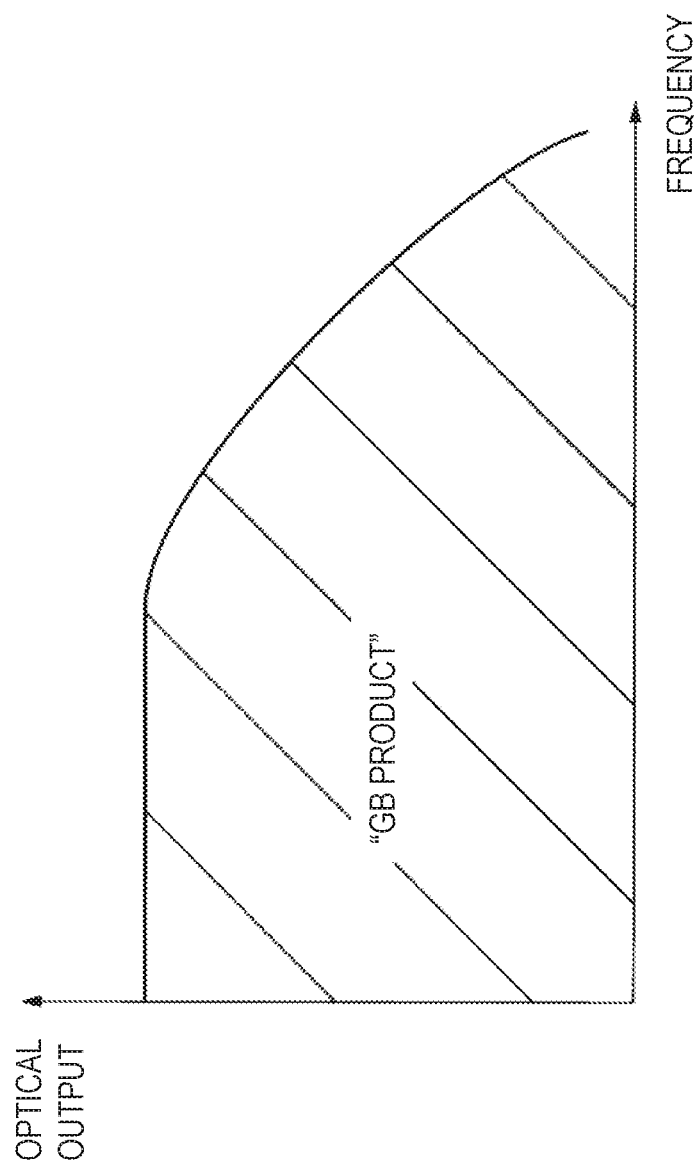
FIG. 2 is a graphical representation of the "GB product".

In the following embodiments, when required for convenience, the description will be made by dividing into a plurality of sections or embodiments, but except when specifically stated, they are not independent of each other, and one is related to the modified example, detail, supplementary description, or the like of part or all of the other.

In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted. Note that even plan view may be hatched for the sake of clarity.

First Embodiment

The first embodiment describes an electronic device comprised of optical transceivers. An optical transceiver is an electronic device that has a function of converting an electrical signal into an optical signal to transmit the optical signal, and receiving the optical signal to convert the optical signal into an electrical signal. The optical transceiver includes a transmission device that converts an electric signal into an optical signal and transmits the optical signal, and the transmission device includes small optical devices for transmission. This small optical device for transmitting is called a TOSA (transmitter optical sub assembly) and is composed of, for example, a semiconductor device including a semiconductor chip in which a semiconductor laser is formed.

In order to realize high-speed optical communication in an optical transmission system, a signal modulation method called a DMT method has attracted attention. In the following, first, the DMT system will be described.

The DMT system is a signal modulation system based on an orthogonal frequency division multiplexing system. Specifically, the DMT method is a method for realizing high-speed transmission by dividing a frequency band of a transmission path (including an optical transmitter, an optical fiber, and an optical receiver) into a large number of subcarriers and setting an optimal multi-level modulation method for each subcarrier. According to this DMT method, even if the characteristic of a specific subcarrier is deteriorated due to the influence of noise or the like, it is possible to set a modulation method resistant to noise only for that subcarrier, and therefore the DMT method is known as a signal modulation method having high frequency utilization efficiency. For example, in the current binary transmission system (NRZ (Non return to zero) system), signal transmission of about 25 Gbps to 50 Gbps can be performed by one semiconductor laser, whereas in the DMT system, signal transmission of 100 Gbps or more can be realized by one semiconductor laser. Therefore, the DMT system has become one of the candidates of a promising modulation system in high-speed optical communication after 100 G generation.

FIG. 1 is a graph showing the relationship between the optical output and the frequency of a semiconductor laser included in a small optical device for transmission. As shown in FIG. 1, it can be seen that the light output from the semiconductor laser decreases as the frequency increases. Here, in the DMT method, for example, in FIG. 1, the frequency band is divided into a plurality of subcarriers f1 to f5, and a signal is superimposed and modulated on each of the subcarriers f1 to f5. Specifically, in FIG. 1, for example, in each band of the subcarriers f1 to f3, the optical output is "20". At this time, when the noise component is "1", the S/N ratio (signal/noise ratio) is "20", and as a result of, for example, the optical signal can be divided into four, data of 2-bits can be superimposed on each of the subcarriers f1 to f3. On the other hand, in FIG. 1, for example, in each band of the subcarriers f4 to f5, the optical output decreases from "20". At this time, when the noise component is set to "1" the S/N ratio (signal/noise ratio) becomes smaller than "20", and as a result, for example, the optical signal can only be divided into two. As a result, only one bit of data can be superimposed on each of the subcarriers f4 to f5. As described above, for example, in the case of having the frequency characteristic of the optical output shown in FIG. 1, in the DMT system, since data of 2-bits can be superimposed on each of the subcarriers f1 to f3 and data of 1-bit can be superimposed on each of the subcarriers f4 to f5, data of "2-bits×3+1-bits×2=8-bits" in total can be superimposed on one semiconductor laser.

From this, it is understood that the data rate of the optical transceiver in the DMT system is greatly affected by the frequency characteristic of the optical output of the semiconductor laser included in the small optical device for transmission. For example, in FIG. 1, if there is no decrease in optical output in the band of subcarriers f4 to f5, data of 2-bits can be superimposed on each of subcarriers f4 to f5, and as a result, data of "2-bits×5=10-bits" can be superimposed on one semiconductor laser in total. That is, in a certain subcarrier, the larger the S/N ratio is, the more the optical signal can be set to be divided, and therefore, the larger the signal intensity, that is, the value obtained by integrating the optical output of the semiconductor laser with respect to the frequency (hereinafter referred to as "GB product") is, the higher the data rate of the optical transceiver in the DMT system becomes. That is, from the viewpoint of increasing the data rate of the optical transceiver in the DMT system, it is desirable to increase the "GB product" in the frequency characteristic of the optical output of the semiconductor laser included in the small optical device for transmission. FIG. 2 is a diagram visually showing the "GB product". In the graph showing the frequency characteristic of the optical output of the semiconductor laser included in the small optical device for transmission, the area of the hatched region in FIG. 2 corresponds to "GB product". The larger the "GB product" has the frequency characteristic, the higher the data rate of the optical transceiver in the DMT system.

Method for Improving "GB Product"

As described above, from the viewpoint of increasing the data rate of the optical transceiver in the DMT system, it is desirable to increase the "GB product" in the frequency characteristic of the optical output of the semiconductor laser included in the small optical device for transmission. Therefore, a technique for improving the "GB product" will be described below. First, as a first method of improving the "GB product", a method of enlarging a frequency band in which the S/N ratio of an optical signal can be secured in the frequency characteristic of the optical output of a semiconductor laser is considered.

FIG. 3 is a diagram schematically showing a first technique for improving the "GB product". FIG. 3 shows, for example, the frequency characteristic of the optical output of the semiconductor laser included in the small optical device for transmission, and in the graph showing this frequency characteristic, the "GB product" is increased by shifting from the characteristic shown by the dotted line to the characteristic shown by the solid line as shown by the arrow. Specifically, in the frequency characteristic of the optical output of the semiconductor laser shown in FIG. 3, for example, in each band of the subcarriers f1 to f4, the optical output is "20". At this time, when the noise component is "1", the S/N ratio (signal/noise ratio) is "20", and as a result of, for example, the optical signal can be divided into four, data of 2-bits can be superimposed on each of the subcarriers f1 to f4. That is, in the frequency characteristic shown in FIG. 1 (see the dotted line in FIG. 3), the subcarriers that can divide the optical signal into four are the three frequency bands of the subcarriers f1 to f3, whereas in the frequency characteristic shown by the solid line in FIG. 3, the subcarriers that can divide the optical signal into four are the four frequency bands of the subcarriers f1 to f4. Further, in the frequency characteristic shown in FIG. (see the dotted line in FIG. 3), since the S/N ratio of the optical signal of the semiconductor laser cannot be secured in the frequency band higher than the subcarrier f5, the frequency band higher than the subcarrier f5 cannot be used as the subcarrier on which the data is superimposed. Therefore, in the frequency characteristic shown in FIG. 1 (see the dotted line in FIG. 3), the subcarriers on which data is superimposed are five frequency bands of subcarriers f1 to f5. On the other hand, in the frequency characteristic shown by the solid line in FIG. 3, even in the subcarrier f6 which is a higher frequency band than the subcarrier f5, the S/N ratio of the optical signal of the semiconductor laser can be ensured, so that the subcarrier f6 can also be used as a subcarrier on which data is superimposed. More specifically, for example, the S/N ratio capable of dividing the optical signal into two is secured even in the respective bands of the subcarriers f5 to f6. As a result, in the frequency characteristic shown by the solid line in FIG. 3, one bit of data can be superimposed on each of the subcarriers f5 to f6.

From the above, for example, in the case of having the frequency characteristic of the optical output shown by the solid line in FIG. 3, in the DMT system, since data of 2-bits can be superimposed on each of the subcarriers f1 to f4 and data of 1-bit can be superimposed on each of the subcarriers f5 to f6, data of "2-bits×4+1-bits×2=10-bits" can be superimposed on one semiconductor laser in total. That is, as shown in FIG. 3, by improving the frequency band, in the frequency characteristic shown by the solid line in FIG. 3, the "GB product" becomes larger than the frequency characteristic shown in FIG. 1 (see the dotted line in FIG. 3), and as a result, the data rate of the optical transceiver in the DMT system can be increased.

However, the first technique for improving the "GB product" is strongly limited by the characteristics of the semiconductor chip itself in which the semiconductor laser is formed. For this reason, for example, it is difficult to realize by merely improving the mounting structure of a small optical device for transmission. That is, the present inventors have studied to improve the "GB product" by improving the mounting structure of a small optical device for transmission including a semiconductor chip in which a semiconductor laser is formed. This is because improving the mounting structure of a small optical device for transmission including a semiconductor chip in which a semiconductor laser is formed is much easier to realize than improving the characteristics of the semiconductor chip itself in which the semiconductor laser is formed. That is, it is relatively easy to improve the mounting structure of the small optical device for transmission, as compared with the design of the structure of the semiconductor laser itself, the process change, or the like.

Therefore, the present inventor focuses on a second technique for improving the "GB product" different from the first technique for improving the "GB product" from the viewpoint of improving the data rate of the optical transceiver in the DMT system by improving the mounting structure of the small optical device for transmission. The second technique for improving the "GB product" is a novel finding found by the present inventors.

Novel Knowledge Discovered by Inventor
("Second Method to Improve GB Product")

The novel Knowledge discovered by the inventor is the finding of improving the optical output at a particular frequency (hereinafter referred to as "peaking") in the frequency characteristics of the optical output of a semiconductor laser. Hereinafter, this knowledge will be described with reference to FIG. 4.

Figure 4:
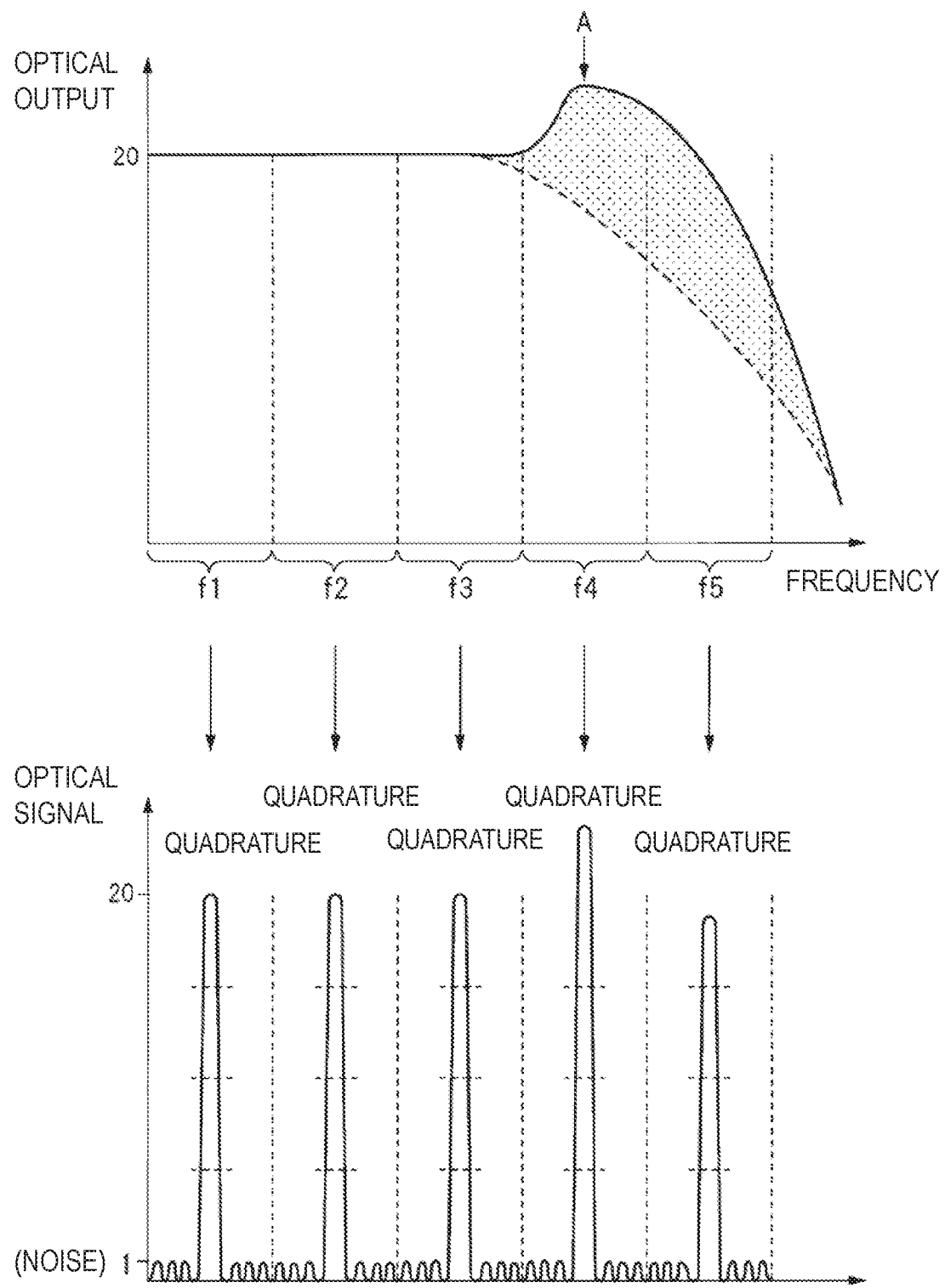
FIG. 4 is a diagram illustrating a "peaking" in the frequency characteristic of an optical output.

FIG. 4 is a diagram for explaining "peaking" in the frequency characteristic of the optical output of the semiconductor laser. FIG. 4 shows, for example, the frequency characteristic of the optical output of the semiconductor laser included in the small optical device for transmission, and in the graph showing this frequency characteristic, the "GB product" is increased by shifting from the characteristic shown by the dotted line to the characteristic shown by the solid line by "peaking". Specifically, in FIG. 4, by causing "peaking" in the frequency band of the subcarriers f4 to f5 in which the optical output decreases, the optical output in the frequency band of the subcarriers f4 to f5 can be improved. As a result, the area of the dotted region in FIG. 4 contributes to the improvement of the "GB product", thereby making it possible to increase the data rate of the optical transceiver in the DMT system.

In the frequency characteristic of the optical output of the semiconductor laser shown in FIG. 4, for example, in each band of the subcarriers f1 to f3, the optical output is "20". On the other hand, in the subcarrier f4, "peaking" causes the optical output to be larger than "20", and also in the subcarrier f5, the optical output approaches "20". As a result, when the noise component is set to "1", the S/N ratio (signal/noise ratio) can be set to "20" or more in the subcarriers f1 to f4, and can be set to "20" or more in the subcarrier f5. Therefore, for example, in the frequency characteristic of the optical output of the semiconductor laser shown in FIG. 4, the optical signal in each of the subcarriers f1 to f5 can be divided into four by "peaking", so that data of 2-bits can be superimposed on each of the subcarriers f1 to f5. That is, in the frequency characteristic without "peaking" shown by the dotted line in FIG. 4, the subcarriers that can divide the optical signal into four are the three frequency bands of the subcarriers f1 to f3, whereas in the frequency characteristic with "peaking" shown by the solid line in FIG. 4, the subcarriers that can divide the optical signal into four are the five frequency bands of the subcarriers f1 to f5.

As described above, for example, in the case where the DMT system has the frequency characteristic of "peaking" shown by the solid line in FIG. 4, since data of 2-bits can be superimposed on each of the subcarriers f1 to f5, data of "2-bits×5=10-bits" in total can be superimposed on one semiconductor laser. That is, by causing "peaking" as shown in FIG. 4, in the frequency characteristic shown by the solid line in FIG. 4, the "GB product" becomes larger than the frequency characteristic shown by the dotted line in FIG. 4, and as a result, the data rate of the optical transceiver in the DMT system can be increased.

The novel finding found by the present inventors is the finding that "peaking" occurs at a specific frequency included in the frequency band of the subcarrier in which the optical output is lowered, and this finding is the second technique for improving the "GB product". The second technique for improving the "GB product" is effective for improving the data rate of the optical transceiver in the DMT system, but for example, in the NRZ system (binary transmission system), the signal quality is deteriorated. That is, if "peaking" is caused in the NRZ system, particularly at a specific frequency included in a high frequency band in which the optical output is lowered, the signal quality is lowered.

Figure 5:
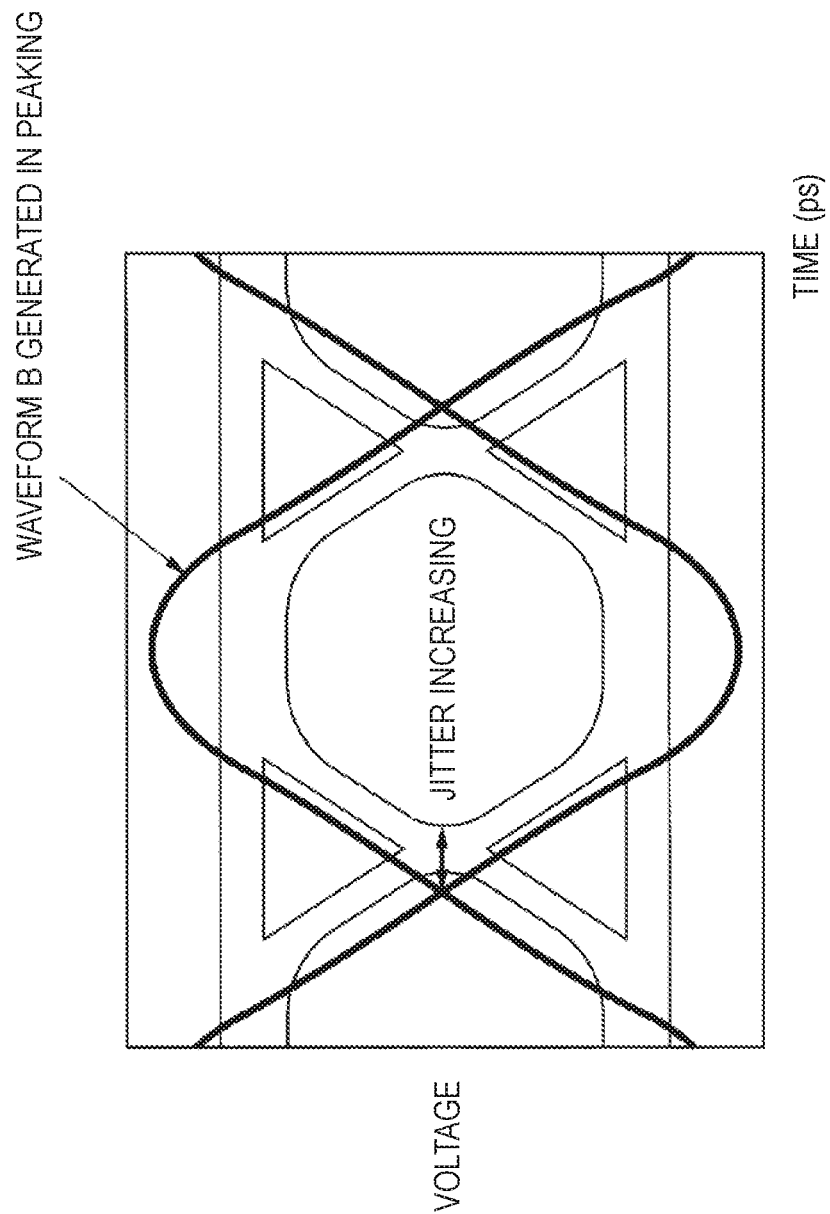
FIG. 5 is a drawing showing the signal wave form of the NRZ system.

This point will be described below. FIG. 5 is a diagram showing a signal waveform (eye pattern) of the NRZ system (binary transmission system). In FIG. 5, when "peaking" is generated in the high-frequency component of the signal waveform of the NRZ system, the high-frequency component increases in the Fourier component of the signal waveform of the NRZ system, resulting in the waveform B generated in the peaking shown in FIG. 5. As a result, as shown in FIG. 5, the jitter of the signal waveform increases and the signal quality decreases. Therefore, in the NRZ method, the second method of improving the "GB product" in which "peaking" is caused at a specific frequency in a high frequency band in which the optical output is lowered, on the contrary, lowers the signal quality.

As described above, the second technique for improving the "GB product" by causing "peaking" to occur at a specific frequency included in the frequency band of the subcarrier in which the optical output is lowered is not applied to the DMT method, and the remarkable effect that the data rate of the optical transceiver can be improved can be obtained. The second technique for improving the "GB product" of causing "peaking" at a specific frequency included in the frequency band of the subcarrier in which the optical output is lowered can be realized by improving the mounting structure of a small optical device for transmission including a semiconductor chip in which a semiconductor laser is formed. That is, unlike the first technique for improving the "GB product", the second technique for improving the "GB product" is useful in that it can be realized by devising a mounting structure of a small optical device for transmission which is easier to realize than the structural design or process change of the semiconductor laser itself.

Outline of Basic Idea in First Embodiment

Next, an outline of the basic idea in the first embodiment, which embodies the second technique for improving the "GB product" which is the novel knowledge found by the inventor, will be described. The basic idea of the first embodiment is outlined as follows. For example, a small optical device for transmission includes a semiconductor chip in which a semiconductor laser is formed, while a semiconductor device in which a drive circuit for driving the semiconductor laser is formed is provided outside the small optical device for transmission, and the drive circuit for driving the semiconductor laser and the semiconductor laser existing inside the small optical device for transmission are electrically connected via a transmission line. At this time, the characteristic impedance of the transmission line is not matched with the characteristic impedance of the semiconductor laser, and a part of the electric signal propagating through the transmission line is reflected by the mismatch between the characteristic impedance of the transmission line and the characteristic impedance of the semiconductor laser. That is, a reflection loss of an electric signal occurs between the transmission line and the semiconductor laser. In this regard, the basic idea of the first embodiment is to suppress reflections caused by the mismatch of the characteristic impedance between the transmission lines and the semiconductor lasers at specified frequencies. In this case, when the mismatch of the characteristic impedance between the transmission line and the semiconductor laser is alleviated at the specific frequency, the reflection loss of the electric signal at the specific frequency is reduced. The reduction of the reflection loss of the electric signal at the specific frequency means that the electric signal at the specific frequency input to drive the semiconductor laser without being reflected increases, thereby increasing the light output from the semiconductor laser at the specific frequency. As a result, at a specific frequency, "peaking" occurs in which the light output from the semiconductor laser increases. Thus, the outline of the basic idea in the first embodiment is the idea that at a particular frequency, by suppressing reflectives resulting from mismatches in the characteristic impedance between the transmission line and the semiconductor laser, the optical output from the semiconductor laser will be "peaked."

Basic Idea in First Embodiment

Next, the following is an explanation of the containment of reflectives resulting from mismatches in the characteristic impedance between the transmission line and the semiconductor laser. In this explanation, first, the reason why the characteristic impedance mismatch occurs between the transmission line and the semiconductor laser will be explained using the related art, and thereafter, the basic idea of the first embodiment, which is a device for suppressing the characteristic impedance mismatch between the transmission line and the semiconductor laser at a specified frequency, will be explained.

Explanation of Related Art

The "related art" referred to in the present specification is a technology having a problem newly found by the inventor, and is not a known prior art, but is a technology described with the intention of a prerequisite technology (unknown technology) of a new technical idea, although it is not a known prior art.

Figure 6:
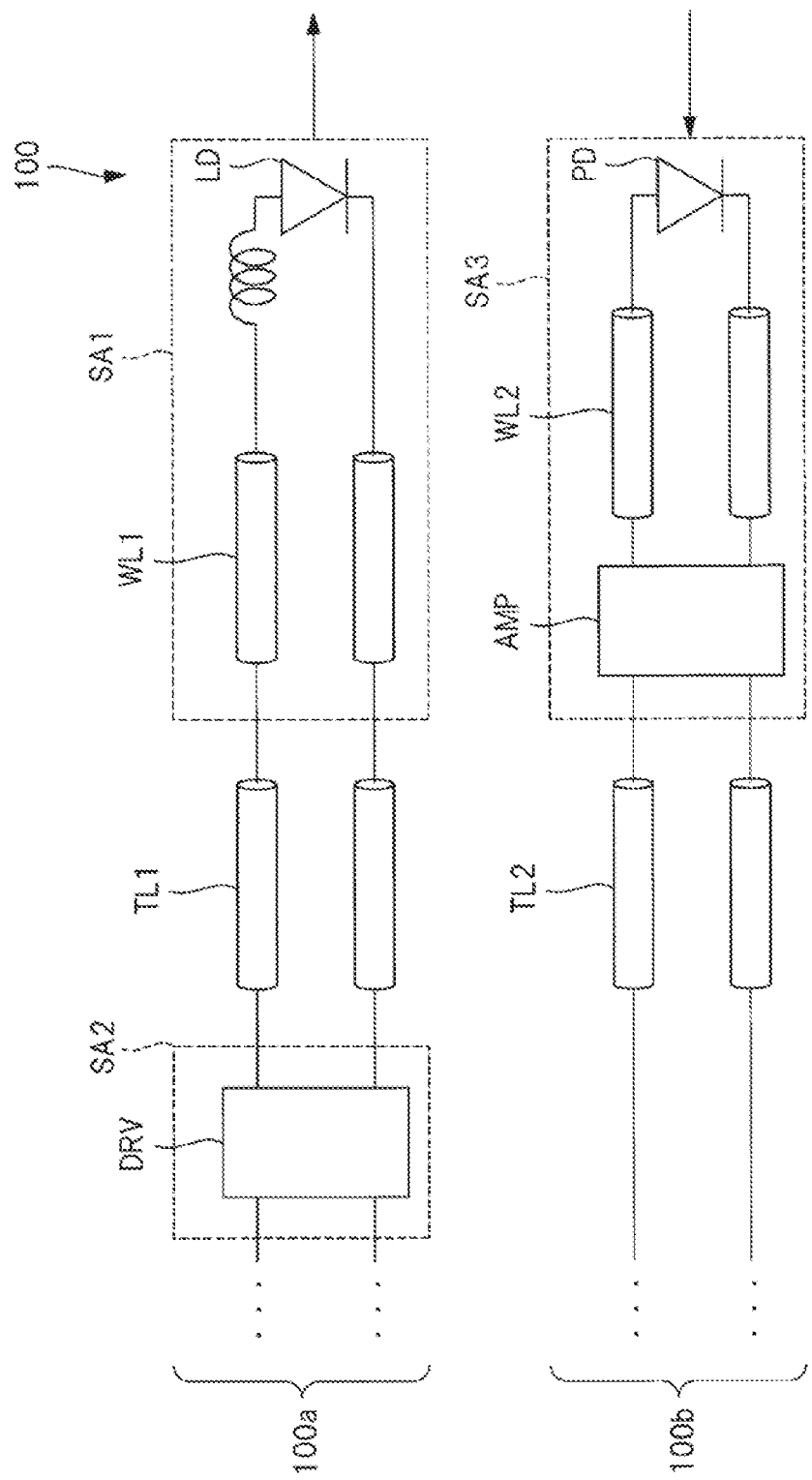
FIG. 6 is a block diagram illustrating a schematic configuration of an optical transceiver in a related art.

FIG. 6 is a block diagram showing a schematic configuration of an optical transceiver in the related art. As shown in FIG. 6, the optical transceiver 100 in the related art includes a transmitter 100a and a receiver 100b.

The transmitting unit 100a has a semiconductor device SA1 including a wiring WL1, a semiconductor laser LD electrically connected to the wiring WL1, and a semiconductor device SA2 including a driving circuit DRV for driving the semiconductor laser LD. In the transmitter 100a, the semiconductor device SA1 and the semiconductor device SA2 are electrically connected to each other by a transmission line TL1. As a result, the semiconductor laser LD included in the semiconductor device SA1 is controlled by the driver DRV included in the semiconductor device SA2. That is, the driving circuit DRV is configured to directly modulate the semiconductor laser LD based on the electric signal, and thereby, an optical signal directly modulated based on the electric signal is output from the semiconductor laser LD. In this manner, the transmission unit 100a of the optical transceiver 100 is configured.

Next, the receiving unit 100b has a photodiode PD, a wiring WL2 connected to the photodiode PD, a semiconductor device SA3 including an amplifier AMP electrically connected to the wiring WL2, a transmission line TL2 electrically connected to the semiconductor device SA3, and a signal processing circuit (not shown in FIG. 6) electrically connected to the transmission line TL2. In the receiving unit 100b configured as described above, when an optical signal is input to the photodiode PD, the photodiode PD photoelectrically converts the optical signal to generate a current signal. The current signal is inputted to the amplifier AMP through the wiring WL2 and converted into a voltage signal.

For example, the current signal (output signal) output from the photodiode PD is minute, and the signal format is often not suitable for processing of a signal processing circuit (digital circuit). Therefore, a circuit for amplifying a minute current signal output from the photodiode PD to a signal having a magnitude suitable for input to the signal processing circuit is required. In particular, while the current signal output from the photodiode PD is an analog signal, the signal processing circuit needs an AD conversion circuit that converts the analog signal into a digital signal in order to handle the digital signal. However, in the AD conversion circuit that converts an analog signal into a digital signal, only a voltage signal can be received. Therefore, a transimpedance amplifier for amplifying a voltage signal of an appropriate magnitude while converting a current signal into a voltage signal is required. Therefore, the amplifier AMP included in the semiconductor device SA3 is composed of, for example, a transimpedance amplifier which is an analogue circuit serving as both a converter circuit and an amplifier circuit.

Here, in the receiving unit 100b, the photodiodes PDs and the amplifiers AMPs are built in the semiconductor device SAs 3, and the reason for this will be described. The photodiode PD is composed of, for example, a pn junction diode. In the pn junction diode, when light enters the depletion layer in a state where a reverse bias voltage is applied to the pn junction, electrons in the valence band are excited in the conduction band by the light energy. As a result, electrons are excited in the conduction band, while holes are generated in the valence band. The electrons excited in the conduction band are accelerated by the reverse bias voltage and drift toward the cathode (n-type semiconductor region), while the holes generated in the valence band drift toward the anode (p-type semiconductor region). As a result, in the photodiode PD, a current flows when light is input. That is, in the photodiode PD, the input optical signal is converted into a current signal.

The current signals outputted from the photodiodes PDs are inputted to the amplifiers AMPs via the wires WL2. At this time, as the length of the wiring WL2 increases, the parasitic capacitance of the wiring WL2 increases. The higher the frequency of the optical signal, the higher the frequency of the current signal to be converted. As a result, the impedance of the wire WL2 becomes smaller than the impedance of the current signal, which is a high-frequency signal, so that the leakage current leaking from the current signal to the ground becomes larger. Since the current signal output from the photodiode PD is weak, if the leakage current from the weak current signal increases, the signal-to-noise ratio of the current signal decreases. Therefore, from the viewpoint of ensuring the S/N ratio of the current signals outputted from the photodiodes PDs, the necessity of reducing the parasitic capacitance of the wiring WL2 by shortening the length of the wiring WL2 as much as possible is increased. Therefore, in the related art, both the photodiodes PD and the amplifiers AMP are built in the semiconductor device SA3. Therefore, in the receiving unit 100b of the optical transceiver 100 according to the related art, the length of the wiring WL2 for electrically connecting the photodiodes PD and the amplifier AMP can be shortened, and as a result, the parasitic capacitance of the wiring WL2 can be reduced. For the above reasons, in the receiver 100b of the optical transceiver 100, the photodiodes PD and the amplifiers AMP are built in the semiconductor device SA3.

On the other hand, in the transmitting unit 100a of the optical transceiver 100, the driving circuit DRV for driving the semiconductor laser LD is not incorporated in the semiconductor device SA1, and the driving circuit DRV is disposed outside the semiconductor device SA1. This is because of the following reasons. In other words, even in the transmitting unit 100a of the optical transceiver 100, it is desirable to incorporate the driving circuit DRV together with the semiconductor laser LD within the semiconductor device SA1 from the viewpoint of improving performance (from the viewpoint of signal quality design). However, if the drive circuit DRV is incorporated in the semiconductor device SA1, it is difficult to design the heat radiation of the semiconductor device SA1 because the power consumed by the drive circuit DRV is unnecessarily consumed. Further, the drive circuit DRV for driving the semiconductor laser LD is larger in size than the amplifier AMP composed of a transimpedance amplifier. Therefore, when the driving circuits DRVs are provided inside the semiconductor device SA1, the semiconductor device SA1 becomes large, and it becomes difficult to downsize the semiconductor device SA1 constituting the transmitting unit 100a. That is, in order to realize a configuration in which the drive circuit DRV is arranged inside the semiconductor device SA1 while miniaturizing the semiconductor device SA1 and improving the heat dissipation characteristics, various contrivances must be made, and in view of ease of manufacturing, a configuration in which the drive circuit DRV is provided outside the semiconductor device SA1 in which the semiconductor laser LD is incorporated is currently appropriate. For this reason, the transmitting unit 100a of the optical transceiver 100 in the related art employs a configuration in which the driving circuit DRV is provided in a semiconductor device SA2 different from the semiconductor device SA1 in which the semiconductor laser LD is incorporated, as shown in FIG. 6.

However, in the transmitting unit 100 a of the optical transceiver 100, when the driving circuit DRV for driving the semiconductor laser LD is incorporated in the semiconductor device SA2 different from the semiconductor device SA1 in which the semiconductor laser LD is incorporated, the semiconductor device SA1 and the semiconductor device SA2 need to be connected via the transmission line TL1 in order to electrically connect the semiconductor laser LD and the driving circuit DRV. According to the study by the present inventor, it has become clear that there is room for improvement when the semiconductor device SA1 with the built-in laser LD and the semiconductor device SA2 with the built-in driver DRV are connected to each other by the transmission line TL1. In the following, there will be explained the room for improvement which is manifested in this related art.

Figure 7:
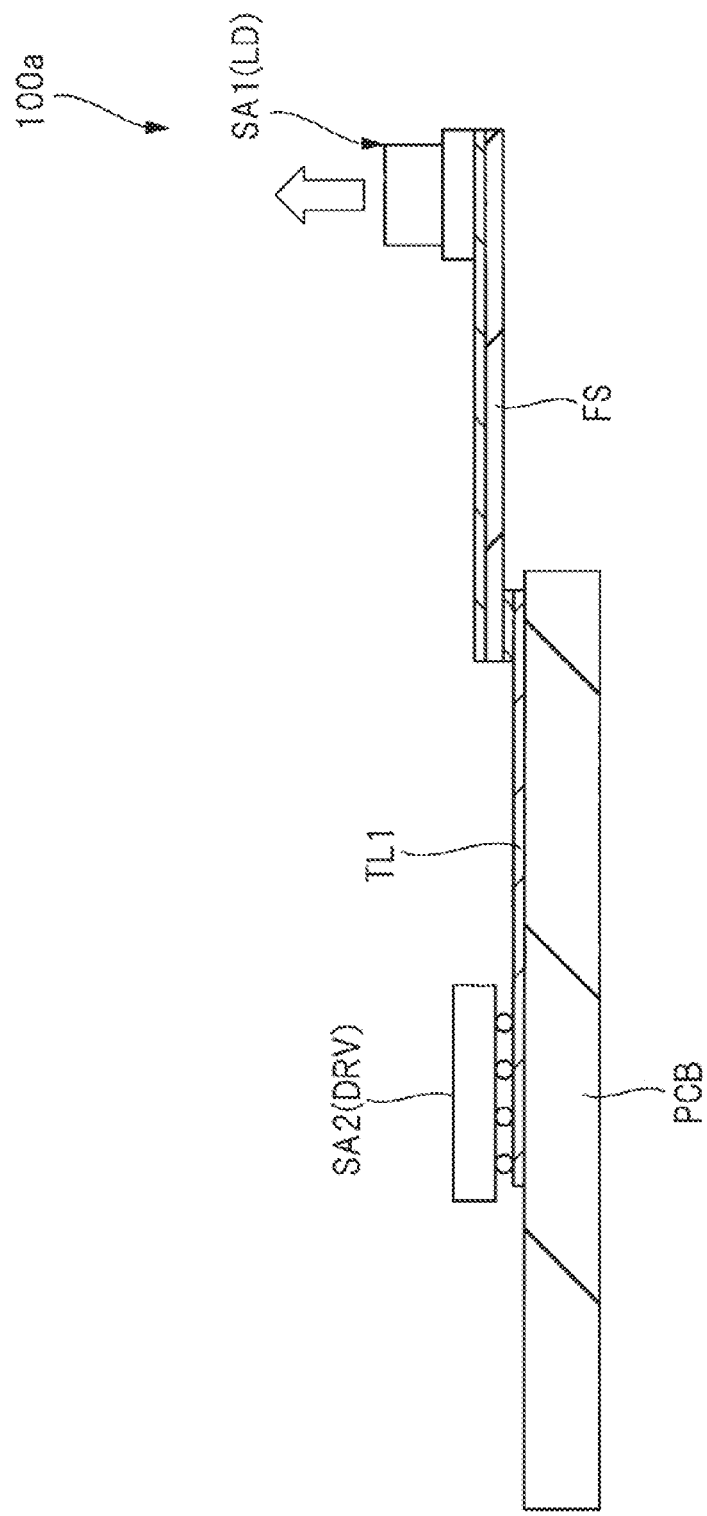
FIG. 7 is a drawing showing a schematic implementation configuration of a transmission portion of an optical transceiver.

FIG. 7 is a diagram showing a schematic mounting configuration of the transmission unit 100a of the optical transceiver 100. As shown in FIG. 7, the transmission unit 100a includes a mounting substrate PCB in which a transmission line TL1 is formed, and a semiconductor device SA2 in which drive circuits DRVs are built is mounted on the mounting substrate PCB. At this time, as shown in FIG. 7, the semiconductor device SA2 in which the driving circuits DRVs are incorporated is electrically connected to the transmission line TL1 formed on the mounted substrate PCBs. Further, the transmission line TL1 formed on the mounting substrate PCB is electrically connected to the flexible substrate FS on which the semiconductor device SA1 including the semiconductor laser LD is mounted. As a result, the semiconductor device SA1 with the built-in laser LD and the semiconductor device SA2 with the built-in driver DRV are electrically connected to each other via the transmission line TL1.

Figure 8:
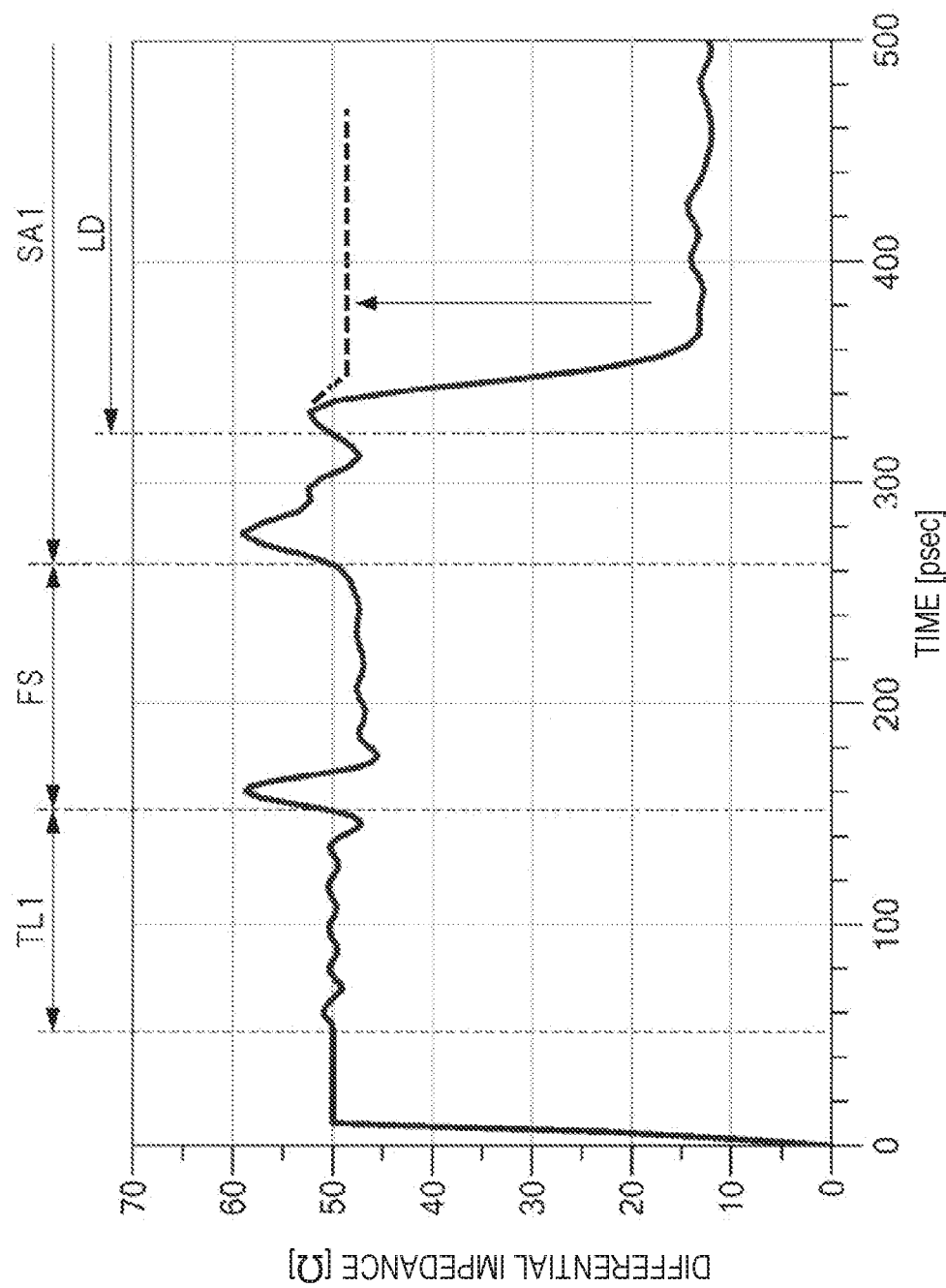
FIG. 8 is a diagram showing differential impedance between a semiconductor device including a semiconductor laser and a transmission line.

When the semiconductor device SA1 with the built-in laser LD and the semiconductor device SA2 with the built-in driving circuit DRV are connected to each other via the transmission line TL1, the impedance matching between the transmission line TL1 and the semiconductor device SA1 is critical from the standpoint of maintaining the signal quality. Specifically, FIG. is a diagram showing differential impedance between the semiconductor device SA1 including the semiconductor laser LD and the transmission line TL1. In FIG. 8, the differential impedance of the transmission line TL1 and the differential impedance of the flexible substrate FS are matched with each other by approximately 50Ω. On the other hand, the differential impedance of the semiconductor laser LD included in the semiconductor device SA1 is about 15Ω, and it is understood that a significant mismatch of the differential impedance occurs between the transmission line TL1 and the semiconductor laser LD. Due to the mismatch between the differential impedance of the transmission line TL1 and the differential impedance of the semiconductor laser LD, a part of the electric signals flowing through the transmission line TL1 is reflected prior to being inputted to the semiconductor laser LD. As a result, the quality of the electrical signal deteriorates due to the mismatch between the differential impedance of the transmission line TL1 and the differential impedance of the semiconductor laser LD. That is, when the semiconductor device SA1 in which the semiconductor laser LD is incorporated and the semiconductor device SA2 in which the driving circuit DRV is incorporated are connected to each other by the transmission line TL1, the performance of the optical transceiver 100 is lowered due to the mismatch between the differential impedance of the transmission line TL1 and the differential impedance of the semiconductor laser LD.

The main cause of the mismatch between the differential impedance of the transmission line TL1 and the differential impedance of the semiconductor laser LD is that the differential impedance of the semiconductor laser LD is significantly lower than the differential impedance of the transmission line TL1.

Hereinafter, the reason why the differential impedance of the semiconductor laser LD is significantly lower than the differential impedance of the transmission line TL1 will be described. First, the semiconductor laser LD is directly modulated under the control of the driving circuit DRV. At this time, as the frequency of the electric signal increases, the frequency of the direct modulation also increases. In order to appropriately realize direct modulation of the semiconductor laser LD even if the frequency of the electric signal increases, it is necessary to improve the response speed of the semiconductor laser LD. In order to improve the response speed of the semiconductor laser LD, it is necessary to reduce the time constant ($\tau=RC$) of the semiconductor laser LD. In this regard, when R (resistance value) is reduced in order to reduce the time constant ($\tau=RC$), the differential impedance of the semiconductor laser LD is reduced. On the other hand, in order to reduce the time constant ($\tau=RC$), when the frequency (f) of direct modulation of the semiconductor laser LD is increased to cope with a higher high-frequency signal even if C (parasitic capacitance) is reduced, the differential impedance ($1/j\omega C$) of the semiconductor laser LD is reduced. In the semiconductor laser LD which performs the direct modulation as described above, the differential impedance tends to be small. As a result, the differential impedance of the semiconductor laser LD, which performs direct modulation, are much smaller than the differential impedance of the transmission line TL1 of the semiconductor laser LD, which performs direct modulation. That is, since the differential impedance of the semiconductor laser LD needs to be reduced in order to realize direct modulation of the semiconductor laser LD corresponding to the high-frequency signals, a mismatch between the differential impedance of the transmission line TL1 and the differential impedance of the semiconductor laser LD occurs.

In this regard, it is conceivable to adopt an indirect modulation method by providing a separate modulator instead of adopting a direct modulation method for the semiconductor laser LD. This is because it is not necessary to directly modulate the light emitted from the semiconductor laser LD, and therefore it is not necessary to reduce the impedance in order to improve the response speed of the semiconductor laser LD. That is, when the indirect modulation method is employed for the semiconductor laser LD, the differential impedance of the semiconductor laser LD can be adjusted to the differential impedance of the transmission line TL1, whereby the mismatch of the differential impedance can be suppressed even when the transmission line TL1 is used.

However, since the indirect modulation method has a higher manufacturing cost than the direct modulation method, the direct modulation method is adopted in the optical transceiver 100. However, as described above, when the direct modulation method is employed, the differential impedance of the semiconductor laser LD needs to be reduced in order to improve the response speed, and as a result, the mismatch between the differential impedance of the transmission line TL1 and the differential impedance of the semiconductor laser LD appears as room for improvement.

Here, for example, if the drive circuit DRV for driving the semiconductor laser LD and the semiconductor laser LD can be incorporated in one semiconductor device SA1, the transmission line TL1 becomes unnecessary, and for example, by adding an equalizer to the drive circuit DRV to adjust the waveform of the electric signals input to the semiconductor laser LD, the waveform degradation input to the semiconductor laser LD can be suppressed. However, as described above, in order to incorporate the drive circuits DRVs in the semiconductor device SA1, various devices need to be implemented, and the hurdles for realizing the drive circuits DRVs are high. Therefore, considering the ease of manufacturing, it is reasonable to adopt a configuration in which the driving circuits DRVs are provided outside the semiconductor device SA1 in which the semiconductor laser LD is built.

From the above, it can be seen that the impedance mismatch between the impedance of the transmission line TL1 and the impedance mismatch between the impedance of the semiconductor laser LD manifests itself as room for improvement, particularly because of (1) the connection between the semiconductor laser LD and the driving circuit DRV via the transmission line TL1 by providing the driving circuit DRV outside the semiconductor device SA1 in which the semiconductor laser LD is incorporated, and (2) the direct modulation of the semiconductor laser LD by the driving circuit DRV.

Therefore, the first embodiment is devised to suppress the mismatch of the characteristic impedance between the transmission line TL1 and the semiconductor laser LD at the specific frequency, thereby reducing the reflection loss and causing the optical output from the semiconductor laser LD to increase ("peaking") at the specific frequency. Hereinafter, the basic idea of the first embodiment to which the present invention is applied will be described.

Detail of Basic Idea

Figure 9:
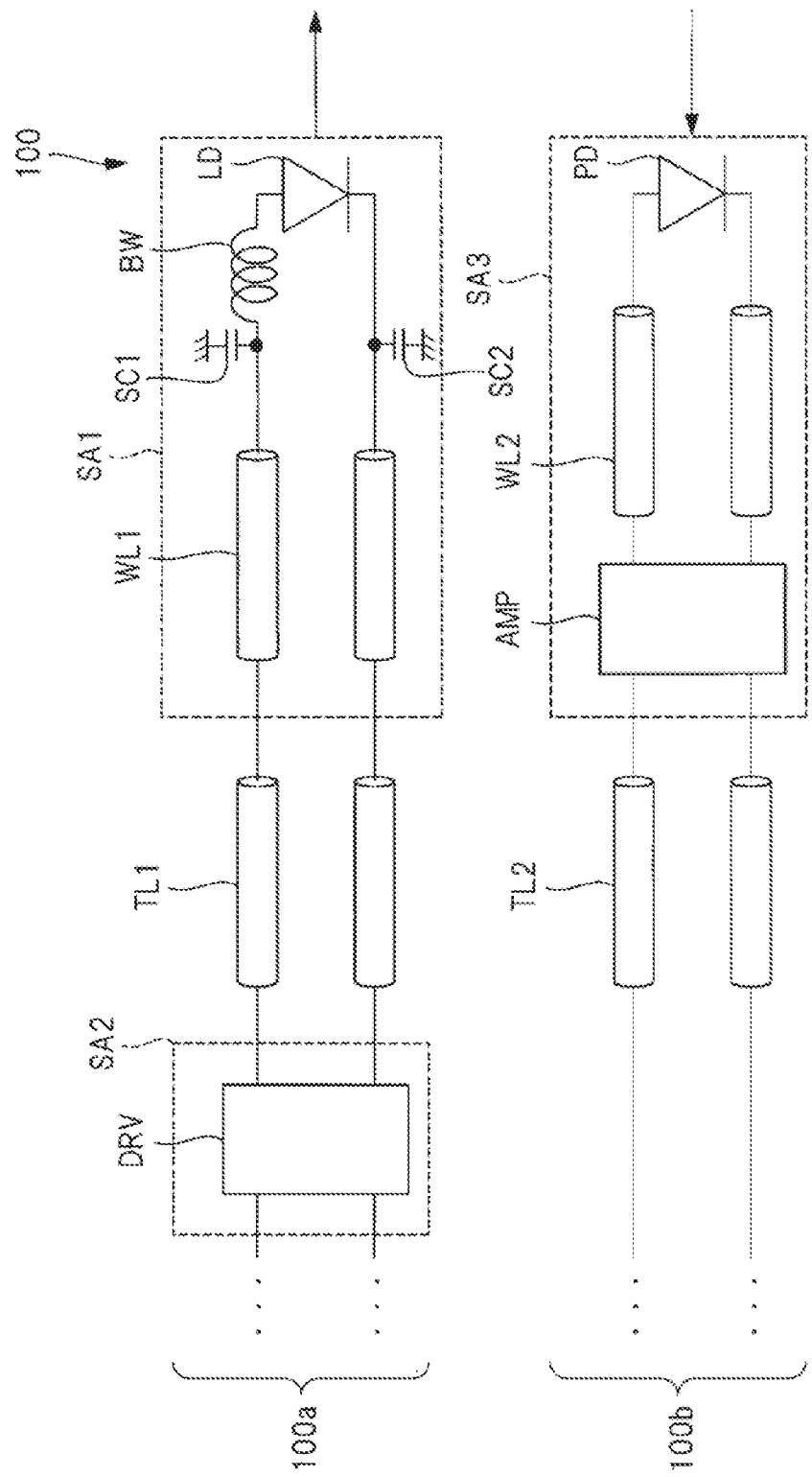
FIG. 9 is a block diagram showing the configuration of an optical transceiver in a first embodiment.

FIG. 9 is a diagram showing a schematic configuration of optical transceivers according to the first embodiment. In FIG. 9, the basic idea of the first embodiment is to provide a shunt capacitance SC1 and a shunt capacitance SC2 in the vicinity of the semiconductor laser LD in order to suppress reflections caused by the mismatch of the characteristic impedance between the transmission line TL1 and the semiconductor laser LD at specified frequencies. In this case, the bonding wire BW and the shunting capacitance SC1 (SC2) are provided in the vicinity of the semiconductor laser LD (approximately equal to the wavelengths of the electromagnetic waves). Therefore, the characteristic impedance of the semiconductor laser LD with respect to the high-frequency signals (electromagnetic waves) is a characteristic impedance obtained by integrally combining the characteristic impedance of the semiconductor laser LD itself, the inductance caused by the bonding wire BW, and the capacitance caused by the shunting capacitance SC1 (SC2). At this time, by adjusting the capacitance of the shunt capacitance SC1 (SC2), the phase caused by the inductance of the bonding wire BW and the phase caused by the capacitance of the shunt capacitance SC1 (SC2) can be made to act in the canceling directions at the specified frequency. Further, the absolute values of the integrated characteristic impedance of the semiconductor laser LD, the bonding wire BW, and the shunt capacitance SC1 (SC2) can be made to approach the characteristic impedance ($Z_0$=50Ω) of the transmission line TL1. As a result, according to the basic idea of the first embodiment, it is possible to suppress the mismatch of the characteristic impedance between the transmission line TL1 and the semiconductor laser LD at the specified frequencies. As a result, according to the basic idea of the first embodiment, it is possible to reduce the reflective losses of high-frequency signals caused by the mismatch between the characteristic impedance of the transmission line TL1 and the semiconductor laser LD. This means that high-frequency signals of a specified frequency can be easily inputted from the transmission line TL1 to the semiconductor laser LD. This in turn means an increase in the drive current of the semiconductor laser LD at a particular frequency, thereby causing "peaking" in the optical output from the semiconductor laser LD. In particular, for example, if the specific frequency causing "peaking" is set to the frequency indicated by "A" in FIG. 4, the "GB product" can be increased by the area of the dot region in FIG. 4. As a result, according to the basic idea of the first embodiment, it is possible to increase the data rate of the optical transceivers in the DMT system.

As described above, the basic idea of the first embodiment is to provide the shunt capacitance SC1 and the shunt capacitance SC2 in the region in the vicinity of the semiconductor laser LD, but hereinafter, by providing the shunt capacitance SC1 and the shunt capacitance SC2 in the region in the vicinity of the semiconductor laser LD, it is possible to alleviate the impedance mismatch and realize the reflection loss of high-frequency signals by referring to the Smith chart.

Figure 10:
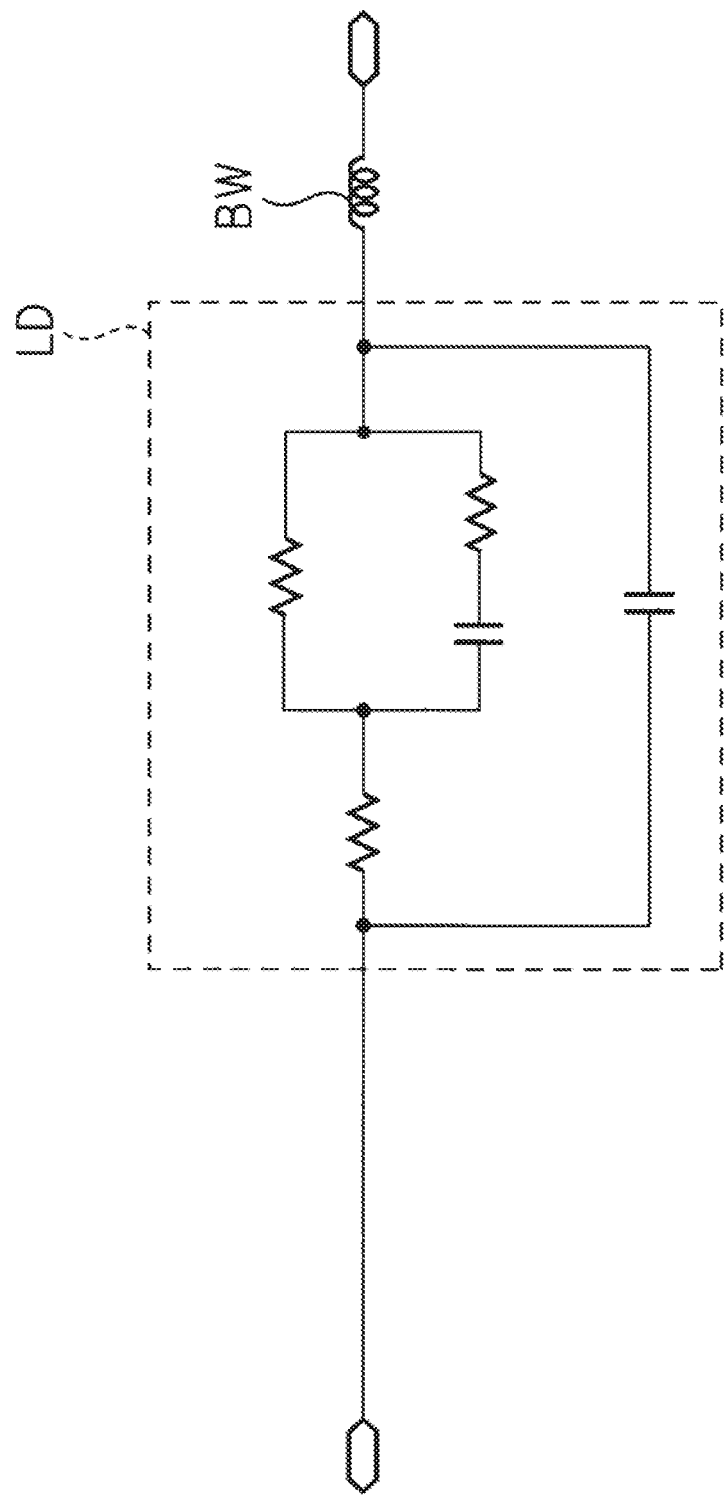
FIG. 10 is an equivalent circuit diagram of a system comprised of a semiconductor laser and a bonding wire included in a semiconductor device in the related art.

FIG. 10 is an equivalent circuit diagram of a system comprised of a semiconductor laser LD and a bonding wire BW included in semiconductor device SA1 (see FIG. 6) in the related art. In FIG. 10, the semiconductor laser LD is represented as an RC circuit in the equivalent circuit diagram. A bonding wire BW is connected in series with the semiconductor laser LD shown by the RC circuit.

The frequency dependence of the characteristic impedance of the system composed of the semiconductor laser LD and the bonding wire BW in the related art configured as described above will be described.

Figure 12:
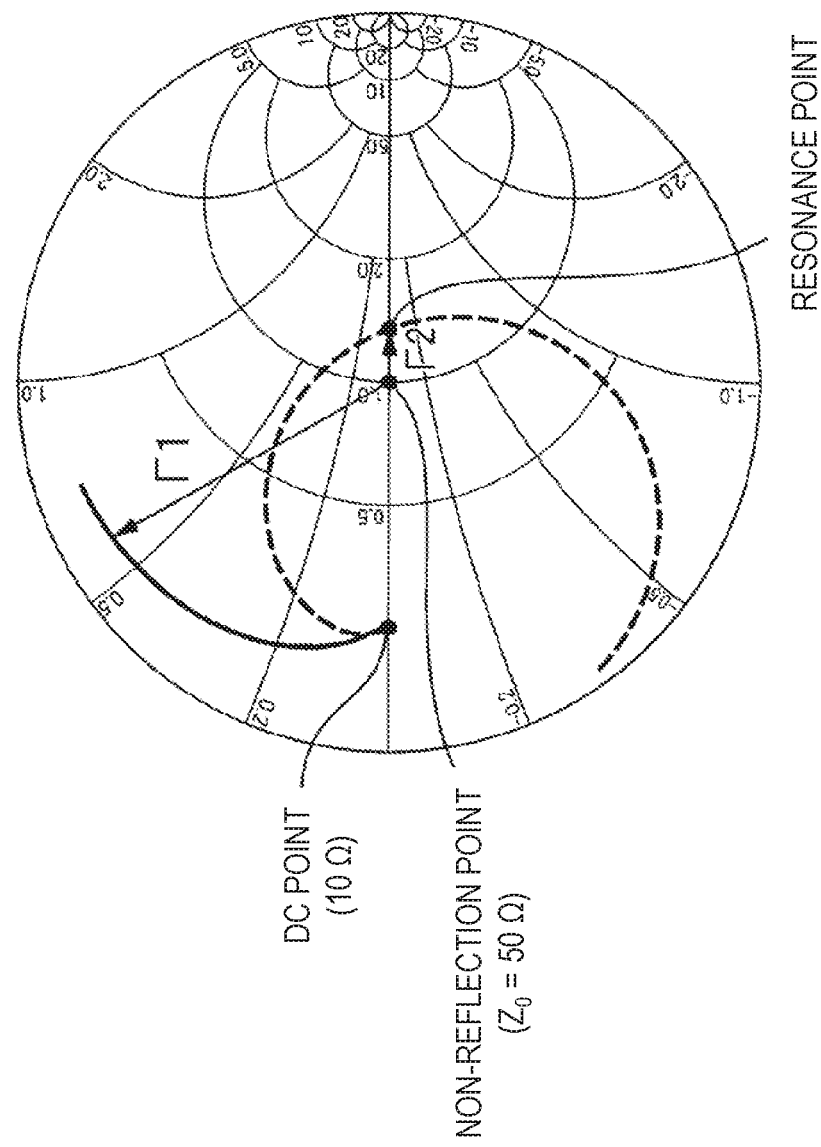
FIG. 12 is a drawing showing a Smith chart.

FIG. 12 is a diagram showing a Smith chart. In the Smith chart shown in FIG. 12, the center point indicates a non-reflection point, and for example, the non-reflection point is a point whose characteristic impedance corresponds to 50Ω. The solid line in FIG. 12 shows the frequency dependence of the characteristic impedance of the system composed of the semiconductor laser LD and the bonding wire BW up to 40 GHz in the related art. As shown by the solid line in FIG. 12, in the related art, it can be seen that the distance from the non-reflection point increases because the inductance component ($j\omega L$) of the bonding wire BW monotonously increases as the frequency increases (as $\omega$ increases). Since the distance from the non-reflection point indicates the absolute value of the reflection coefficient Λ1, it can be seen that in the related art, the reflection loss increases as the frequency increases. In other words, in the related art, the reflection loss cannot be reduced at a specific frequency of 40 GHz or less, for example. In other words, in the related art, it is difficult to reduce the reflective losses of high-frequency signals caused by the mismatch between the characteristic impedance of the transmission line TL1 and the semiconductor laser LD. Accordingly, in the related art, it is difficult to achieve high data rates of optical transceivers in the DMT method because it is difficult to "peaks" the optical output from the semiconductor laser LD.

Figure 11:
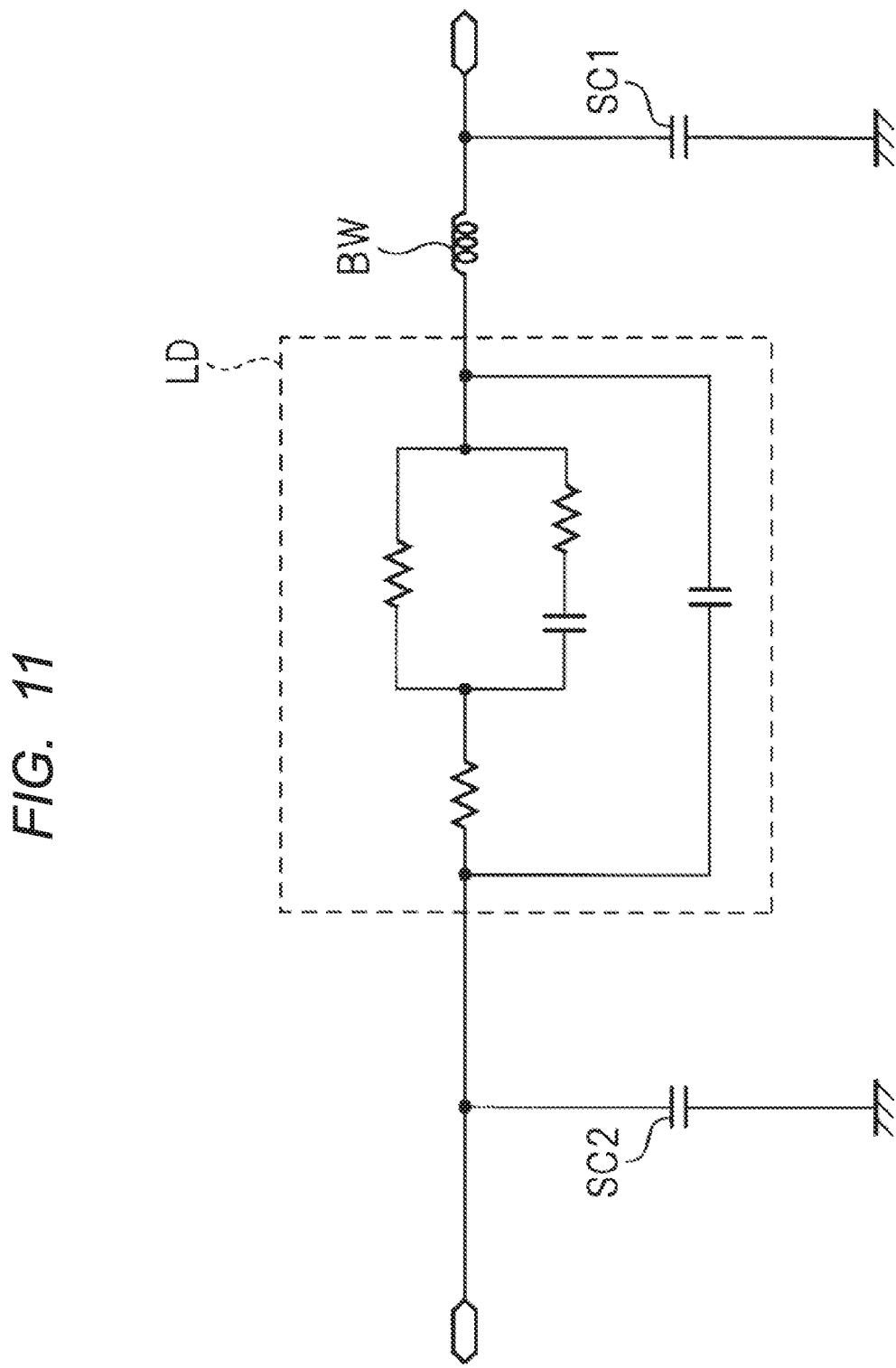
FIG. 11 is an equivalent circuit diagram of a system comprised of a semiconductor laser contained in a semiconductor device in the first embodiment, a bonding wire, and a shunt capacitance.

On the other hand, FIG. 11 is an equivalent circuit diagram of a system including the semiconductor laser LD, the bonding wire BW, and the shunt capacitance SC1 (SC2) included in the semiconductor device SA1 (see FIG. 9) in the first embodiment. In FIG. 11, the semiconductor laser LD is represented as an RC circuit in the equivalent circuit diagram. The bonding wire BW is connected in series with the semiconductor laser LD shown in the RC circuit, the shunt capacitance SC1 is connected between the anode of the semiconductor laser LD and the ground via the bonding wire BW, and the shunt capacitance SC2 is connected between the cathode of the semiconductor laser LD and the ground.

The frequency-dependence of the characteristic impedance of the system composed of the semiconductor laser LD, the bonding wire BW, and the shunt capacitance SC1 (SC2) in the first embodiment configured as described above will be described.

FIG. 12 is a diagram showing a Smith chart. The dotted line in FIG. 12 shows the frequency-dependence of the characteristic impedance of the semiconductor laser LD, the bonding wire BW, and the shunt capacitance SC1 (SC2) of the semiconductor laser LD, the bonding wire BW, and the shunt capacitance SC1 (SC2) in the first embodiment up to 40 GHz. As shown by the dotted line in FIG. 12, in the first embodiment, as the frequency increases, the phase caused by the inductance of the bonding wire BW is canceled by the phase caused by the capacitance of the shunt capacitance SC1 (SC2), and the frequency crosses a horizontal line where the reactance becomes "0". The point of intersection between the dotted line in FIG. 12 and the horizontal line in which the reactance is "0" is the resonance point of the system composed of the semiconductor laser LD, the bonding wire BW, and the shunt capacitance SC1 (SC2) in the first embodiment. That is, in the system including the semiconductor laser LD, the bonding wire BW, and the shunt capacitance SC1 (SC2) in the first embodiment, the parallel resonance can be caused by the inductance caused by the bonding wire BW and the capacitance caused by the shunt capacitance SC1 (SC2). As shown by the dotted line in FIG. 12, since the reflection coefficient Γ2 becomes small at this resonance point, according to the first embodiment, the absolute value of the integrated characteristic impedance of the semiconductor laser LD, the bonding wire BW, and the shunt capacitance SC1 (SC2) can be made close to the characteristic impedance ($Z_0$=50Ω) of the transmission line TL1 at the specific frequency by controlling the parallel resonance. This means that the first embodiment can reduce the return losses at certain frequencies, e.g., 40 GHz or less. In other words, in the first embodiment, by providing the shunting capacitor SC1 (SC2), it is possible to reduce the reflective losses of the high-frequency signals caused by the mismatch between the characteristic impedance of the transmission line TL1 and the semiconductor laser LD. Accordingly, according to the first embodiment, it is possible to "peaks" the optical output from the semiconductor laser LD, thereby improving the data rate of the optical transceiver in the DMT scheme.

Figure 13:
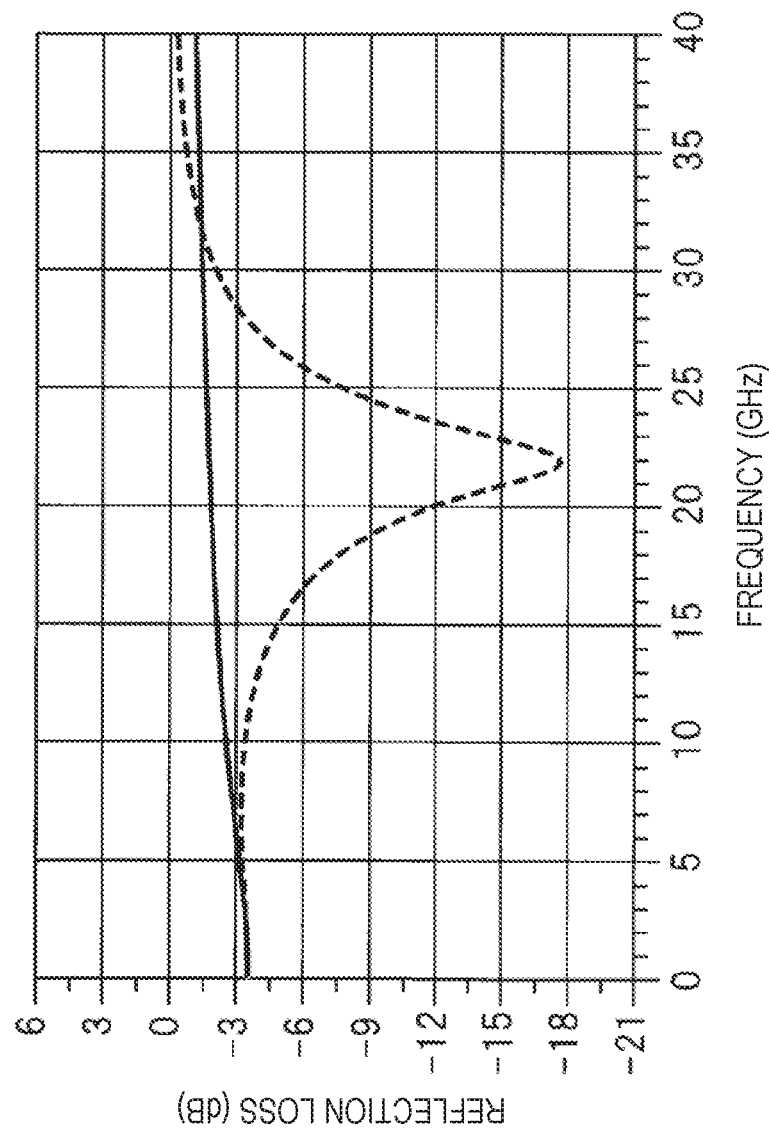
FIG. 13 is a graph showing the relationship between frequency and reflection loss.

FIG. 13 is a graph showing the relationship between frequency and reflection loss. The solid line in FIG. 13 is a graph showing the frequency dependence of the reflection loss in the related art. On the other hand, the broken line in FIG. 13 is a graph showing the frequency-dependency of the reflective losses in the first embodiment.

The solid line in FIG. 13 showing the related art has a frequency characteristic in which the reflection loss monotonously increases as the frequency increases. Accordingly, in the related art, it is difficult to "peaks" the optical output from the semiconductor laser LD because the reflection loss cannot be reduced at a particular frequency. Therefore, in the related art, it is understood that the data rate of the optical transceiver in the DMT system cannot be increased by "peaking".

On the other hand, in the broken line of FIG. 13 showing the first embodiment, it can be seen that the reflectance losses can be remarkably reduced at a specified frequency around 22 GHz, for example. Accordingly, in the first embodiment, reflection losses can be reduced at a particular frequency (around 22 GHz), thereby allowing "peaking" of the optical output from the semiconductor laser LD. As a result, it is understood that the data rate of the optical transceivers in the DMT system can be increased by "peaking" in the first embodiment.

As shown in FIG. 13, for example, when the frequency is 30 GHz or more, the first embodiment has higher reflectance losses than the related art. However, in the frequency range of 30 GHz or more, there is no problem because the frequency band is a frequency band in which there is no optical output of the semiconductor laser alone.

Figure 14:
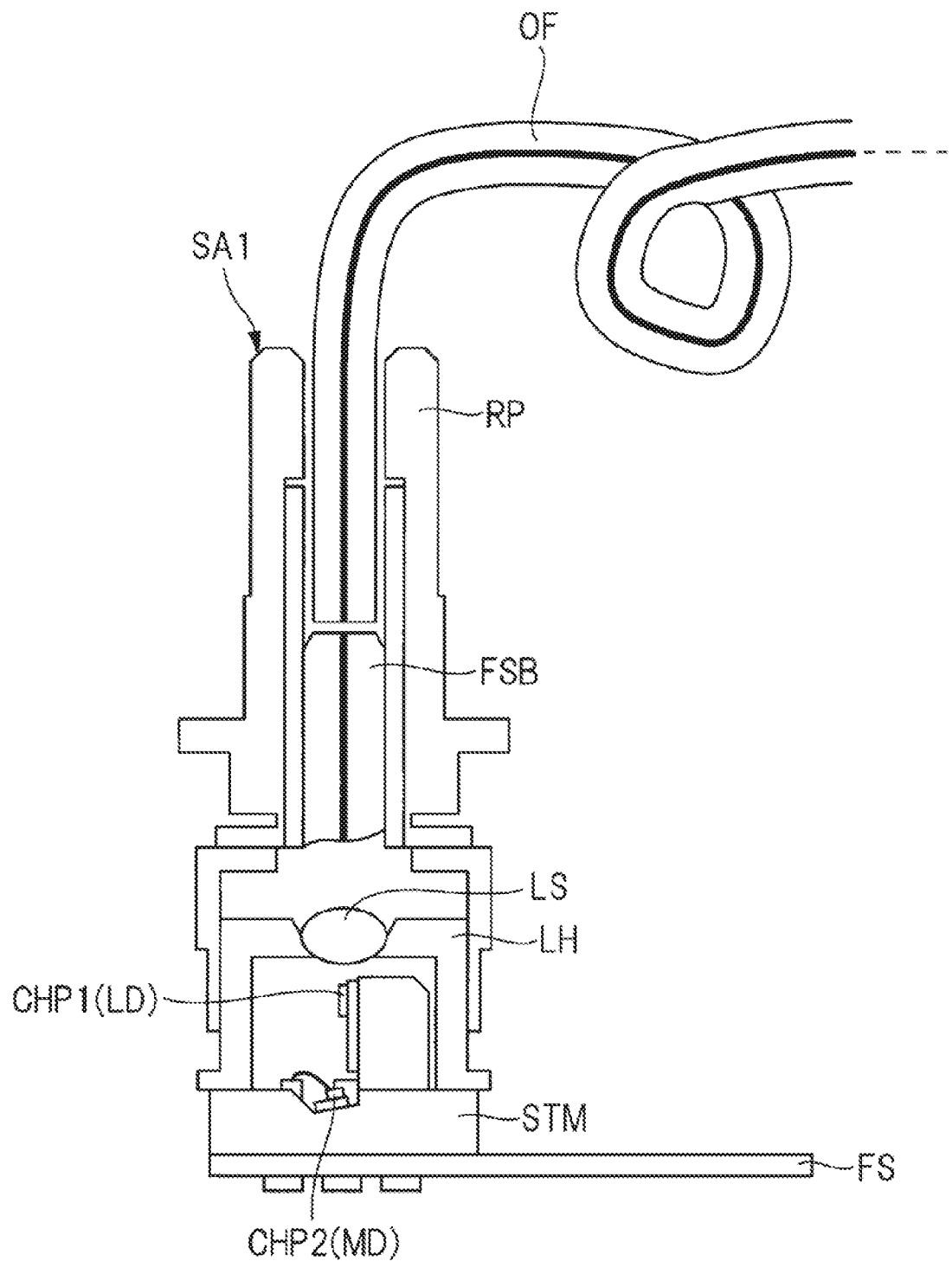
FIG. 14 is a diagram showing a schematic configuration of a semiconductor device which is a small optical device for transmitting.

Next, a configuration of a semiconductor device that embodies the basic idea of the first embodiment will be described. FIG. 14 is a diagram showing a schematic configuration of a semiconductor device SA1 which is a small optical device (TOSA) for transmitting. As shown in FIG. 14, the semiconductor device SA1 includes a stem STM on which a semiconductor chip CHP1 in which a semiconductor laser LD is formed and a semiconductor chip CHP2 in which a monitor photodiode MD is formed are mounted, a flexible substrate FS connected to the stem STM, and a receptacle RP in which a lens holder LH on which a lens LS is disposed and a fiber stub FSB are incorporated. The semiconductor device SA1 configured as described above is connected to the optical fibers OF and finally incorporated in the optical communication systems.

Figure 15:
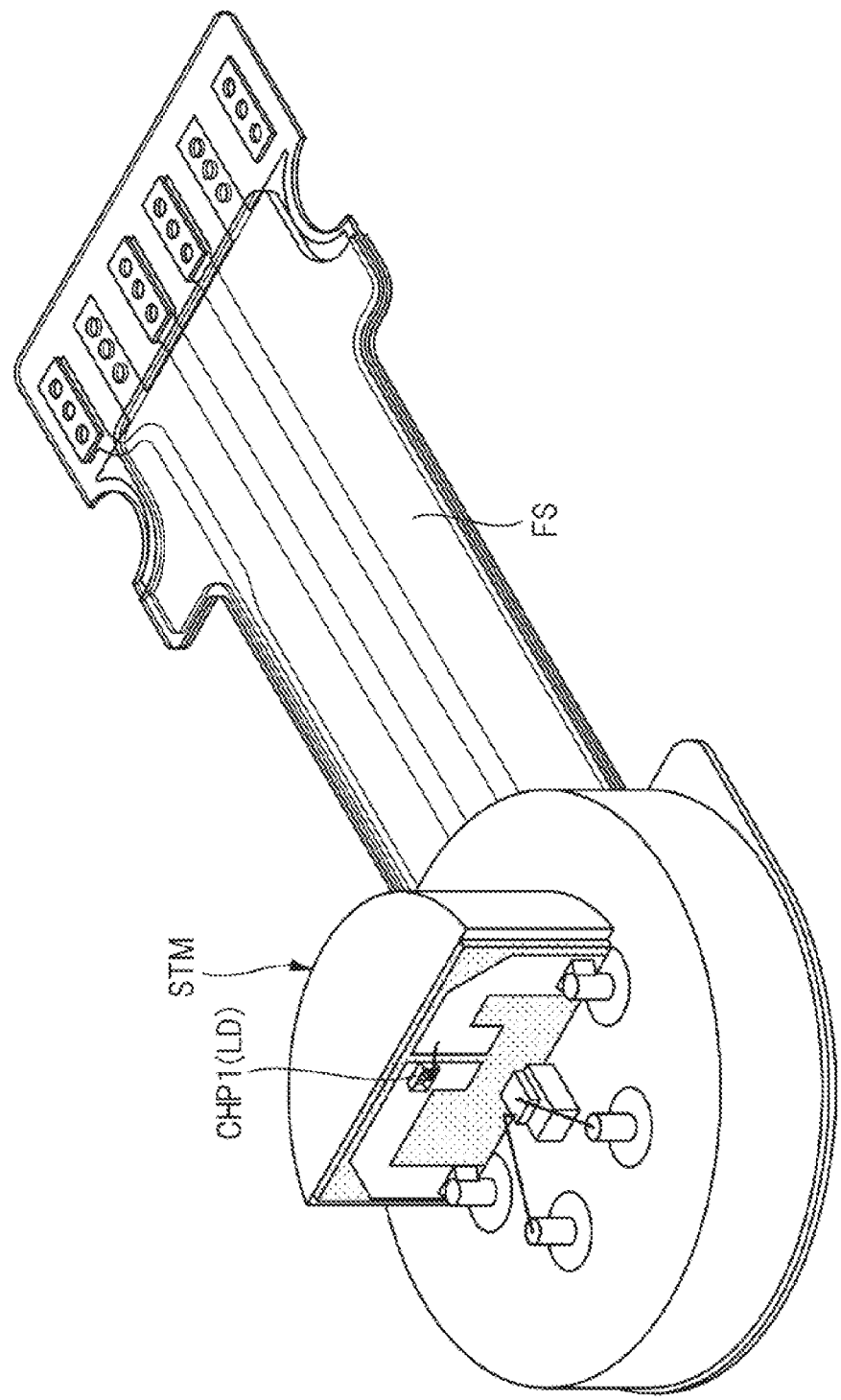
FIG. 15 is a perspective view schematically showing the stem and the flexible substrate that form part of the semiconductor device.

FIG. 15 is a perspective view schematically showing a stem STM and a flexible substrate FS which form a part of the semiconductor device SA1. In FIG. 15, the stem STM and the flexible substrate FS are portions corresponding to a path along which a high-frequency signal (high-speed signal) in the semiconductor device SA1 propagates. The stem STMs are mounted with the semiconductor chip CHP1 in which the semiconductor laser LD is formed, while the flexible substrate FSs are formed with RF-signal lines. The flexible substrate FS is electrically connected to a driving circuit (not shown) (see FIG. 7).

In other words, the flexible substrate FS has a pair of RF signal lines corresponding to the anodes and cathodes of the semiconductor chip CHP1 in which the semiconductor lasers LD are formed on the core layer using the liquid crystal polymer as the core layer, and a signal line electrically connected to the monitor photodiodes. The flexible substrate FS has a ground plane serving as a reference plane for high-frequency signals below the core layer. Each of the pair of RF signal lines is connected to a pin (RF signal injection pin PN1 and RF signal injection pin PN2 in FIG. 16) provided on the stem STM. On the other hand, the reference plane formed on the flexible substrate FS is electrically connected to pins protruding below the stem STMs, as shown in FIG. 14. The stem STM is made of, for example, a copper material, and functions as a reference plane for high-frequency signals except for the pins and the dielectric substrate.

Figure 16:
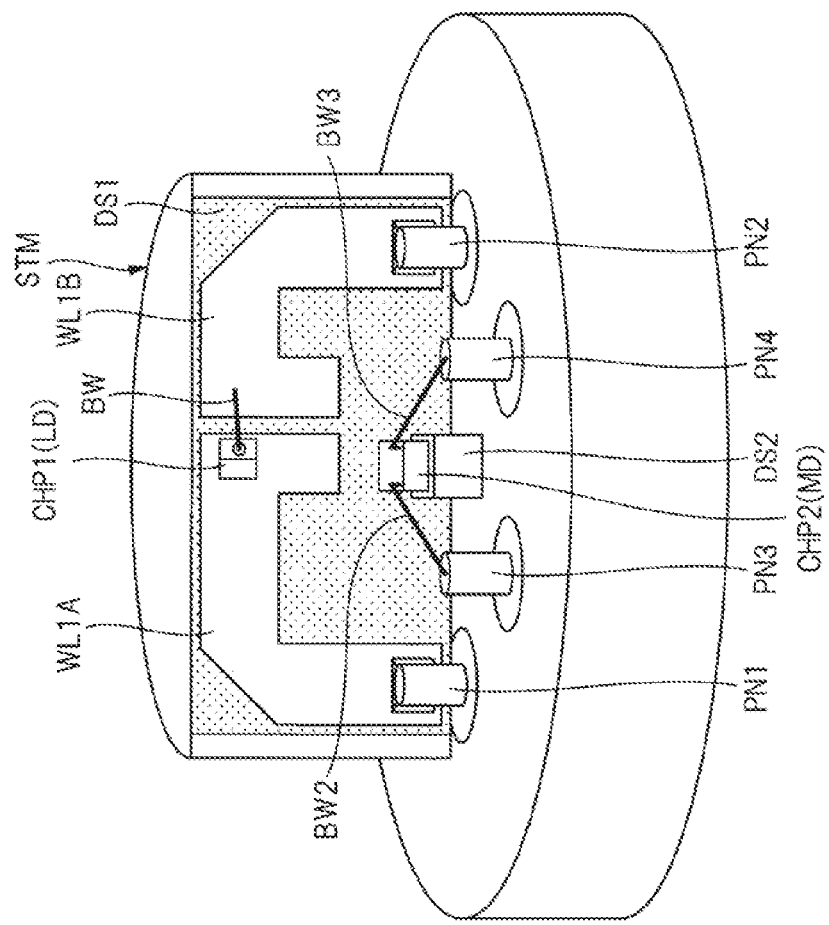
FIG. 16 is a detailed structure of the stem.

Next, FIG. 16 is a diagram showing a detailed configuration of the stem STM. A dielectric substrate DS1 made of, for example, aluminum nitride (AlN) is disposed on the stem STM. Wiring WL1A and wiring WL1B are formed on the surface of the dielectric substrate DS1, and the semiconductor chip CHP1 in which semiconductor lasers LD is formed is mounted on the surface of the wiring WL1A. At this time, the position at which the semiconductor chip CHP1 is mounted is defined by the focal length of the lenses. The back surface of the semiconductor chip CHP1 is brazed to the wiring WL1A formed on the dielectric substrate DS1. Further, the wiring WL1A is connected to the RF-signal implantation pins PN1 by brazing, for example. On the other hand, the wiring WL1B and the semiconductor chip CHP1 are connected to each other by bonding wires BW, and the wiring WL1B is connected to the RF-signal implantation pins PN2 by brazing, for example. That is, the wiring WL1A formed on the dielectric substrate DS1 functions as an RF signal line for supplying a high-frequency signal (RF signal) to the cathode of the semiconductor chip CHP1 in which the semiconductor laser LD is formed. On the other hand, the wiring n WL1B formed on the dielectric substrate DS1 functions as an RF signal line for supplying a high-frequency signal (RF signal) to the anode of the semiconductor chip CHP1.

The wiring WL1A and the wiring WL1B are composed of, for example, a laminated film of a titanium film (film thickness: 0.1 μm), a platinum film (film thickness: 0.2 μm), and a gold film (film thickness: 0.5 μm). The wiring WL1A and the wiring WL1B configured as described above can be formed by using, for example, a common lift-off method or a common patterning technique.

The wiring WL1A and the wiring WL1B can be composed of microstrip lines. For example, the characteristic impedance (single-ended) of the wiring WL1A and the wiring WL1B are 25Ω, and the characteristic impedance (differential impedance) of the wiring WL1A and the wiring WL1B are 50Ω.

As shown in FIG. 16, the stem STM has a semiconductor chip CHP2 in which a monitor photodiode MD for feedback-controlling the optical output from the semiconductor laser LD is formed, and the semiconductor chip CHP2 is mounted on the dielectric substrate DS 2. As shown in FIG. 16, the semiconductor chip CHP2 in which the monitor photodiode MD is formed is connected to the monitor pins PN3 via bonding wires BW2, and is also connected to the monitor pins PN4 via bonding wires BW3.

The dielectric substrate DS 1 and the dielectric substrate DS 2 are made of, for example, aluminum nitride. The back surface of the dielectric substrate DS 1 and the back surface of the dielectric substrate DS 2 are brazed to the stem STMs by, for example, a soldering method. As described above, the dielectric substrate DS 1 and the dielectric substrate DS 2 can be composed of aluminum nitride, but the dielectric substrate DS 1 and the dielectric substrate DS 2 can be selected from various materials from the viewpoints of heat sinks and designing characteristic impedance. For this reason, for example, dielectric materials having a thermal conductivity of 100 W/(m·K) or more at room temperature can be used for the dielectric substrate DS 1 and the dielectric substrate DS 2.

Figure 17:
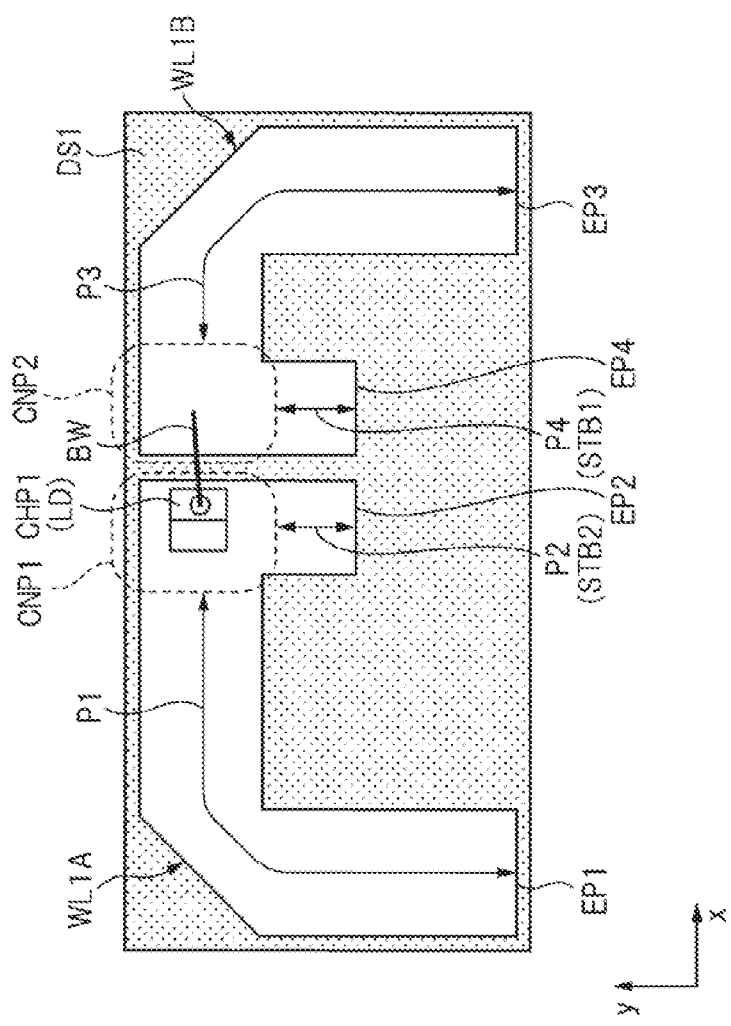
FIG. 17 is a plan view showing a dielectric substrate.

FIG. 17 is a plan view showing the dielectric substrate DS1. In FIG. 17, a wiring WL1A and a wiring WL1B constituting a differential wiring are formed on surfaces of the dielectric substrate DS1. The wiring WL1A has a first portion P1 extended from the end EP1, a second portion P2 extended from the other end EP2, and a corner portion CNP1 connected to each of the first portion P1 and the second portion P2. As described above, the wiring WL1A is comprised of the first portion P1, the second portion P2, and the corner portion CNP1 provided between the first portion P1 and the second portion P2 in plan view. The semiconductor chip CHP1 in which the semiconductor laser is formed is mounted on the corner portion CNP1 of the wiring WL1A. In particular, a cathode electrode is formed on the back surface of the semiconductor chip CHP1, and the cathode electrode formed on the back surface of the semiconductor chip CHP1 is electrically connected to the wiring WL1A. At this time, the length of the first portion P1 extending from the end portion EP1 toward the corner portion CNP1 is longer than the length of the second portion P2 extending from the corner portion CNP1 toward the other end portion EP2. In other words, the length of the second portion P2 is shorter than the length of the first portion P1. The first portion P1 of the wiring WL1A functions as a wiring through which high-frequency signals propagate, while the second portion P2 of the wiring WL1A functions as a stub STB2 contributing to increasing the parasitic capacitance. That is, the first portion P1 of the wiring substrate WL1A is electrically connected to the transmission line interposed between the driving circuit for driving the semiconductor laser and the stem, while the second portion P2 of the wiring WL1A constitutes a stub STB2 serving as a shunt capacitor. As described above, the second portion P2 of the wiring WL1A constitutes a stub STB2 serving as a shunting capacitor for alleviating the mismatch between the characteristic impedance of the semiconductor laser and the characteristic impedance of the differential wiring, i.e., the wiring WL1A and the wiring WL1B of the semiconductor laser.

Subsequently, as shown in FIG. 17, a wiring WL1B that forms a differential wiring in combination with the wiring WL1A is formed on the surface of the dielectric substrate DS1. The wiring WL1B has a third portion P3 extended from the end EP3, a fourth portion P4 extended from the other end EP4, and a corner portion CNP2 connected to the third portion P3 and the fourth portion P4. As described above, the wiring WL1B is composed of the third portion P3, the fourth portion P4, and the corner portion CNP2 provided between the third portion P3 and the fourth portion P4 in plan view. The semiconductor chip CHP1 mounted on the wiring WL1A and the corner portion CNP2 of the wiring WL1B are connected to each other by a conductive member represented by a bonding wire BW, for example. In particular, an anode electrode is formed on the surface of the semiconductor chip CHP1, and the anode electrode formed on the surface of the semiconductor chip CHP1 and the corner portion CNP2 of the wiring WL1B are connected by a bonding wire BW. At this time, the length of the third portion P3 extending from the end portion EP3 toward the corner portion CNP2 is longer than the length of the fourth portion P4 extending from the corner portion CNP2 toward the other end portion EP4. In other words, the length of the fourth portion P4 is shorter than the length of the third portion P3. The third portion P3 of the wiring WL1B functions as a wiring through which high-frequency signals propagate, while the fourth portion P4 of the wiring WL1B functions as a stub STB1 contributing to increasing the parasitic capacitance. That is, while the third portion P3 of the wiring substrate WL1B is electrically connected to the transmission line interposed between the driving circuit for driving the semiconductor laser and the stem, the fourth portion P4 of the wiring WL1B constitutes a stub STB1 serving as a shunting capacitor. As described above, the fourth portion P4 of the wiring WL1B constitutes a stub STB1 serving as a shunting capacitor for alleviating the mismatch between the characteristic impedance of the semiconductor laser and the characteristic impedance of the differential wiring, i.e., the wiring WL1A and the wiring WL1B of the semiconductor laser.

Here, as shown in FIG. 17, the corner portion CNP1 of the wiring WL1A and the corner portion CNP2 of the wiring WL1B are disposed so as to face each other. Further, the second portion P2 of the wiring WL1A extends in the y direction, and the fourth portion P4 of the wiring WL1B also extends in the y direction. Therefore, as shown in FIG. 17, the second portion P2 of the wiring WL1A and the fourth portion P4 of the wiring WL1B are arranged in parallel with each other.

As described above, the semiconductor device SA1, which is the transmitting small optical device (TOSA) according to the first embodiment, is mounted and configured. The basic idea in the first embodiment of providing shunting capacitors in the vicinity of the mounting regions of the semiconductor chip in which the semiconductor laser is formed is realized by providing a second portion P2 of the wiring WL1A and a fourth portion P4 of the wiring WL1B, as shown in FIG. 17, for example. That is, the second portion P2 of the wiring WL1A is a stub STB2 contributing to an increase in parasitic capacitance, the stub STB2 functions as a shunt capacitance, the fourth portion P4 of the wiring WL1B is a stub STB1 contributing to an increase in parasitic capacitance, and the stub STB1 functions as a shunt capacitance.

In particular, in FIG. 17, it is desirable that the extension length (length in the y-direction) of the second portion P2 of the wiring WL1A constituting the stub STB2 is less than ¼ of the wavelength of the high-frequency signals. Similarly, it is desirable that the extension length of the fourth portion P4 of the wiring WL1B constituting the stub STB1 in the y-direction is less than ¼ of the wavelengths of the high-frequency signals. This is because, when the length of each of the extended length (y-direction) of the stub STB2 and the extended length (y-direction) of the stub STB1 is less than ¼ of the wavelengths of the high-frequency signals, the effect of the inductances which cancel the capacitances is reduced, and the stub STB2 and the stub STB1 mainly function as the capacitances. In other words, if the length of each of the extended length (y-direction) of the stub STB2 and the extended length (y-direction) of the stub STB1 is ¼ or more of the wavelengths of the high-frequency signals, the effect of the inductances that cancel the capacitances becomes large.

Feature of First Embodiment

The first embodiment is characterized in that, for example, as shown in FIG. 17, a second portion P2 functioning as a stub STB2 is provided in the wiring WL1A, and a fourth portion P4 functioning as a stub STB1 is provided in the wiring WL1B.

This allows the semiconductor device in first embodiment to "peaks" the optical output from the semiconductor laser because the reflective losses can be reduced at a particular frequency. As a result, in the first embodiment, the data rate of the optical transceivers in the DMT system can be increased by "peaking".

Figure 18:
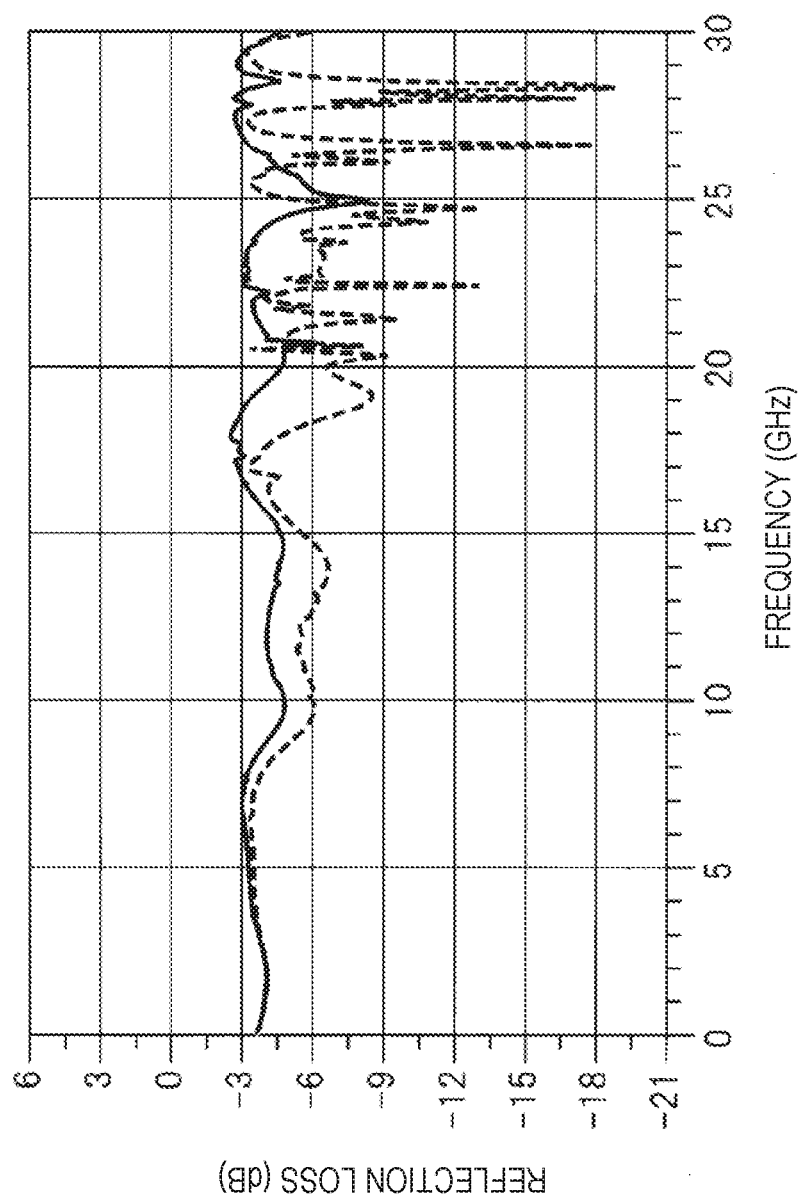
FIG. 18 is a graph showing the frequency characteristics of the reflection loss when it is assumed that a small optical device for transmission is connected to a transmission line having a differential impedance of 50 ohms and a length of 5 mm.

Specifically, FIG. 18 is a graph showing the frequency characteristics of the reflection loss when it is assumed that a transmission small optical device (semiconductor device) for transmission is connected to a transmission line having a differential impedance of 50Ω and a length of 5 mm.

In FIG. 18, the horizontal axis represents frequency (GHz), and the vertical axis represents reflection loss (dB). Here, the solid line in FIG. 18 shows the graph of the related art without the stub STB1 (STB2), while the broken line in FIG. 18 shows the graph of the first embodiment with the stub STB1 (STB2).

As shown in FIG. 18, in the graph (broken line in FIG. 18) showing the frequency characteristic of the first embodiment, it can be seen that the reflection loss of about 1 dB is reduced in the 10 GHz to 15 GHz band and the reflection loss of 1 dB or more is reduced in the 18 GHz to 25 GHz band as compared with the graph (solid line in FIG. 18) showing the frequency characteristic of the related art.

Figure 19:
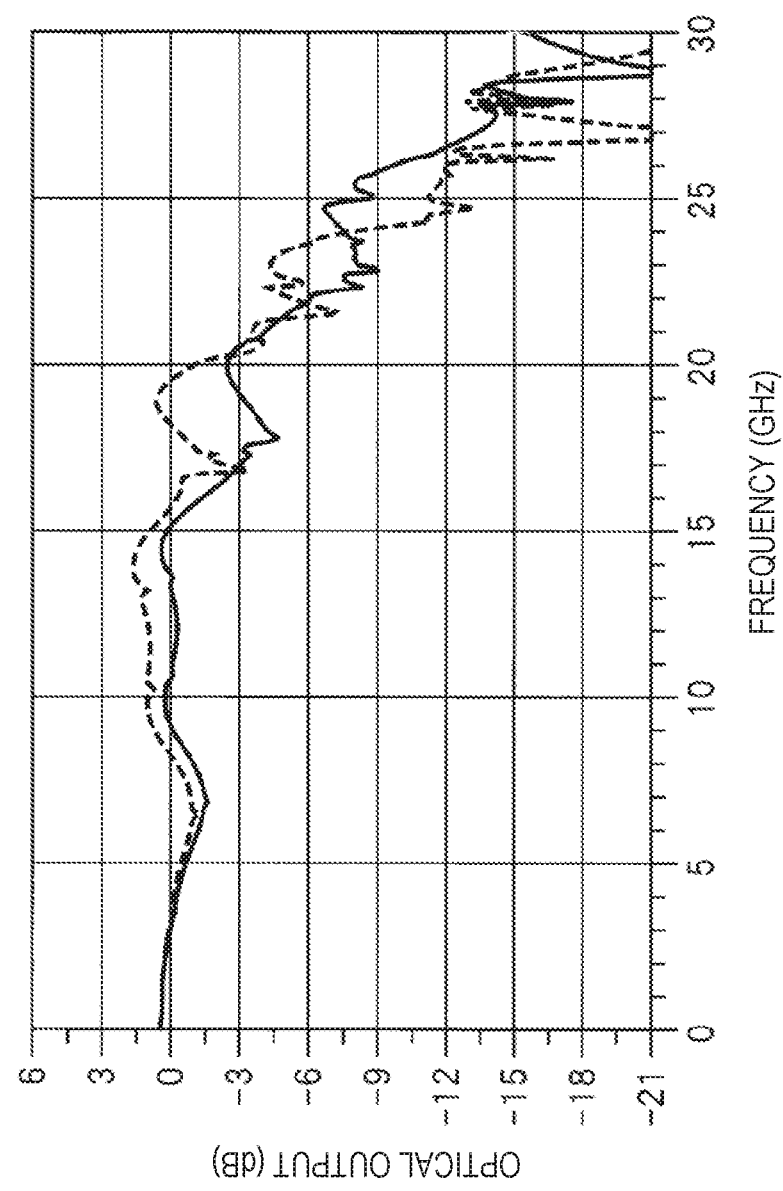
FIG. 19 is a graph showing the frequency characteristics of the optical output from a semiconductor laser when it is assumed that a small optical device for transmission is connected to a transmission line having a differential impedance of 50 ohms and a length of 5 mm.

FIG. 19 is a graph showing the frequency characteristics of the light output from the semiconductor laser when it is assumed that a transmission small optical device (semiconductor device) is connected to a transmission line having a differential impedance of 50Ω and a length of 5 mm.

In FIG. 19, the horizontal axis represents frequency (GHz), and the vertical axis represents optical output (dB).

Here, the solid line in FIG. 19 shows the graph of the related art without the stub STB1 (STB2), while the broken line in FIG. 19 shows the graph of the first embodiment with the stub STB1 (STB2).

As shown in FIG. 19, in the graph (broken line in FIG. 19) showing the frequency characteristic of the first embodiment, it can be seen that the light output in the first embodiment is higher than the light output in the related art up to a frequency around 20 GHz as compared with the graph (solid line in FIG. 19) showing the frequency characteristic of the related art. Further, as shown in FIG. 19, it can be seen that in the first embodiment, "peaking" occurs in which the optical power is higher than 0 dB in the 10 GHz to 20 GHz band. This means that, in the first embodiment, the high-frequency signal (driving current) flowing into the semiconductor chip in which the semiconductor lasers are formed increases at the specified frequency in which reflection is reduced by the parasitic capacitance components controlled by using the stub STB1 (STB2), and it is shown that the optical power from the semiconductor lasers increases if the reflection losses of the high-frequency signals are reduced.

When the "GB product" is calculated with the upper limit of the frequency at which the optical power becomes −3 dB, the "GB product" is larger in the first embodiment than in the related art.

Thus, in the first embodiment, for example, as shown in FIG. 17, since the second portion P2 functioning as the stub STB2 is provided on the wiring WL1A and the fourth portion P4 functioning as the stub STB1 is provided on the wiring WL1B, the reflectance losses at the specified frequencies can be reduced. As a result, according to the characteristic point in the first embodiment, the data rate of the optical transceivers in the DMT system can be increased as a result of an increase in the optical power due to "peaking" by reducing the reflection loss at a particular frequency caused by the control of the parasitic capacitance components by the stub STB1 (STB2).

In the first embodiment, the stub STB1 (STB2) having a rectangular shape is formed, but the object of forming the stub STB1 (STB2) is to control the parasitic capacitance components. Therefore, the shape of the stub STB1 (STB2) is not limited to a rectangular shape, and may be, for example, a circular shape or the like, and is not limited to a planar shape.

Further, when the capacitance value of the shunting capacitance SC2 (SC1) due to the stub STB1 (STB2) is reduced, the resonance frequency of the parallel resonance due to the inductances and the capacitances shifts to a higher frequency band, and the frequency characteristics of the reflection loss such that the Q value becomes smaller can be obtained. In this case, the effect of improving the frequency band in which the "peaking" is suppressed and the optical output is secured can be obtained.

For example, as described above in "<METHOD FOR IMPROVING "GB PRODUCT">", the first method of improving the "GB product" by improving the frequency band is explained to be strongly rate-limited to the characteristics of the semiconductor chip itself in which the semiconductor laser is formed. On the other hand, as described so far, the second method of improving the "GB product" by causing "peaking" at a specified frequency is beneficial in that it can be realized by improving the mounting structure of a small optical device for transmitting by providing a stub STB1 (STB2). Further, even in the second method of improving the "GB product" by causing the "peaking" at a specific frequency, for example, when the specific frequency (resonance frequency) is shifted to a higher frequency band, the Q value of resonance becomes small (the maximum value of the "peaking" decreases and the tail becomes large), and the same advantage as the first method of improving the "GB product" in which the frequency band in which the optical output is secured is improved can be obtained. In other words, the second technique for improving the "GB product" is very excellent in that the same effects as the first technique for improving the "GB product" can be realized by improving the mounting structures of the small optical devices for transmitting by providing the stub STB1 (STB2). In other words, the second technique for improving the "GB product" by causing "peaking" at a specified frequency can cope with both the improvement of the "GB product" by "peaking" and the improvement of the "GB product" by improving the frequency band by merely improving the mounting structures of small optical devices for transmitting by adjusting the resonant condition by controlling the parasitic capacitance components by the stub STB1 (STB2).

Therefore, it is understood that the configuration in which the stub STB1 (STB2) is provided is a configuration having a very wide applicability in that not only the data rate of the DMT-based optical transceiver can be improved by "peaking", but also the data rate of the NRZ-based optical transceiver can be improved by improving the frequency band.

Second Embodiment

In the above-mentioned first embodiment, it has been described that by providing shunting capacitance called a stub in a region near the semiconductor laser, reflections caused by mismatching of characteristic impedance between the transmission line and the semiconductor laser are suppressed at specified frequencies. On the other hand, in the second embodiment, it will be described that by making the differential wirings in the stem close to each other, reflections caused by the mismatch of the characteristic impedance between the transmission lines and the semiconductor lasers are suppressed.

Figure 20:
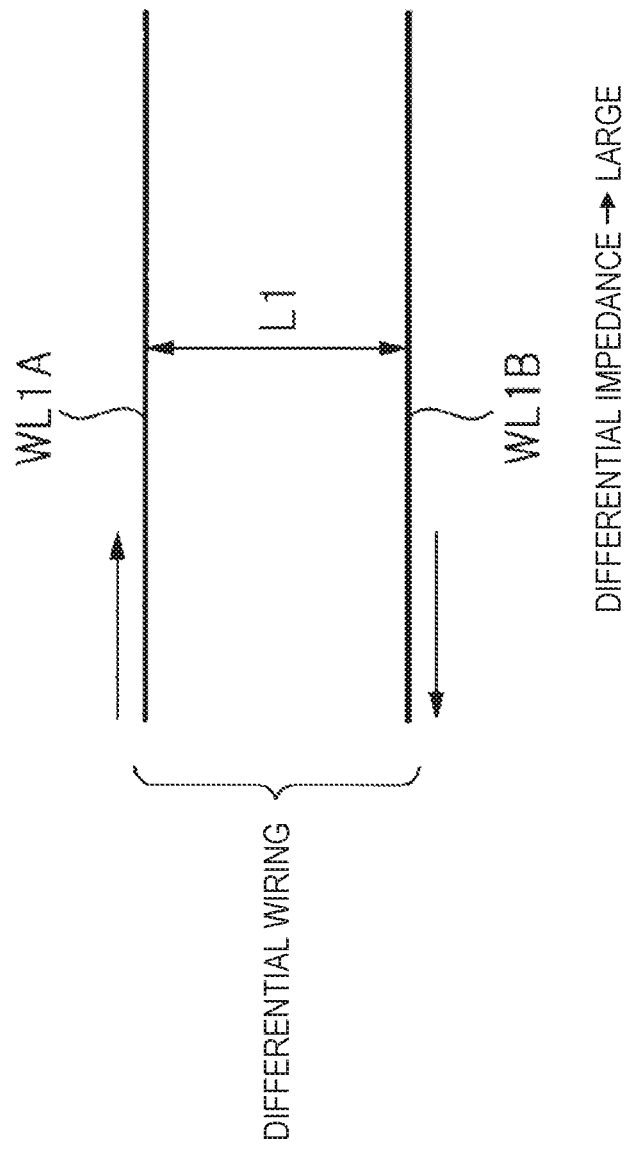
FIG. 20 is a diagram explaining the basic concept for reducing reflection loss.
Figure 21:
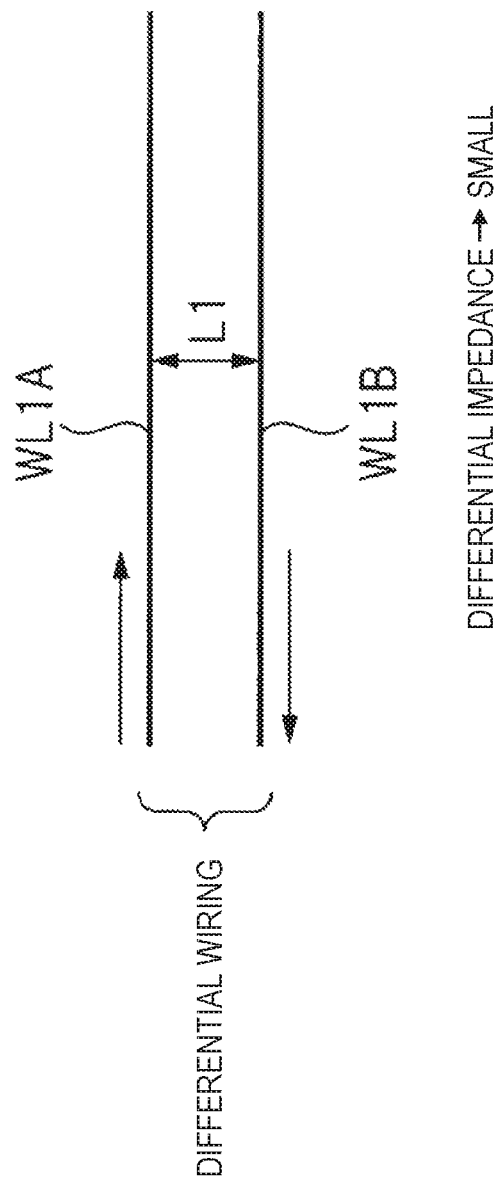
FIG. 21 is a diagram explaining the basic concept for reducing reflection loss.

FIGS. 20 and 21 are diagrams illustrating basic ideas for reducing reflection losses in the second embodiment of reducing reflection losses.

First, as shown in FIG. 20, when the distance L 1 between the wiring WL1A constituting the differential wiring and the wiring WL1B increases, the differential impedance of the differential wiring composed of the wiring WL1A and the wiring WL1B increase. On the other hand, as shown in FIG. 21, when the distance L 1 between the wiring WL1A constituting the differential wiring and the wiring WL1B becomes small, the differential impedance of the differential wiring composed of the wiring WL1A and the wiring WL1B decrease.

Based on this phenomena, the basic idea of reducing the reflective losses in the second embodiment is to reduce the differential impedance of the differential wiring composed of the wiring WL1A and the wiring WL1B formed in the stem so as to approach the characteristic impedance (about 10Ω) of the semiconductor chip in which the semiconductor laser is formed from 50Ω. Specifically, in view of the above-mentioned phenomena, the basic idea of reducing the reflective losses in the second embodiment is to reduce the discontinuity between the differential impedance of the differential wiring and the characteristic impedance of the semiconductor chip in which the semiconductor laser is formed by changing the distance between the wiring WL1A and the wiring WL1B constituting the differential wiring in the direction of decreasing the distance inside the stem. This is based on the principle that the reflection loss of the high-frequency signal is reduced as the discontinuity of the characteristic impedance becomes gradual.

Figure 22:
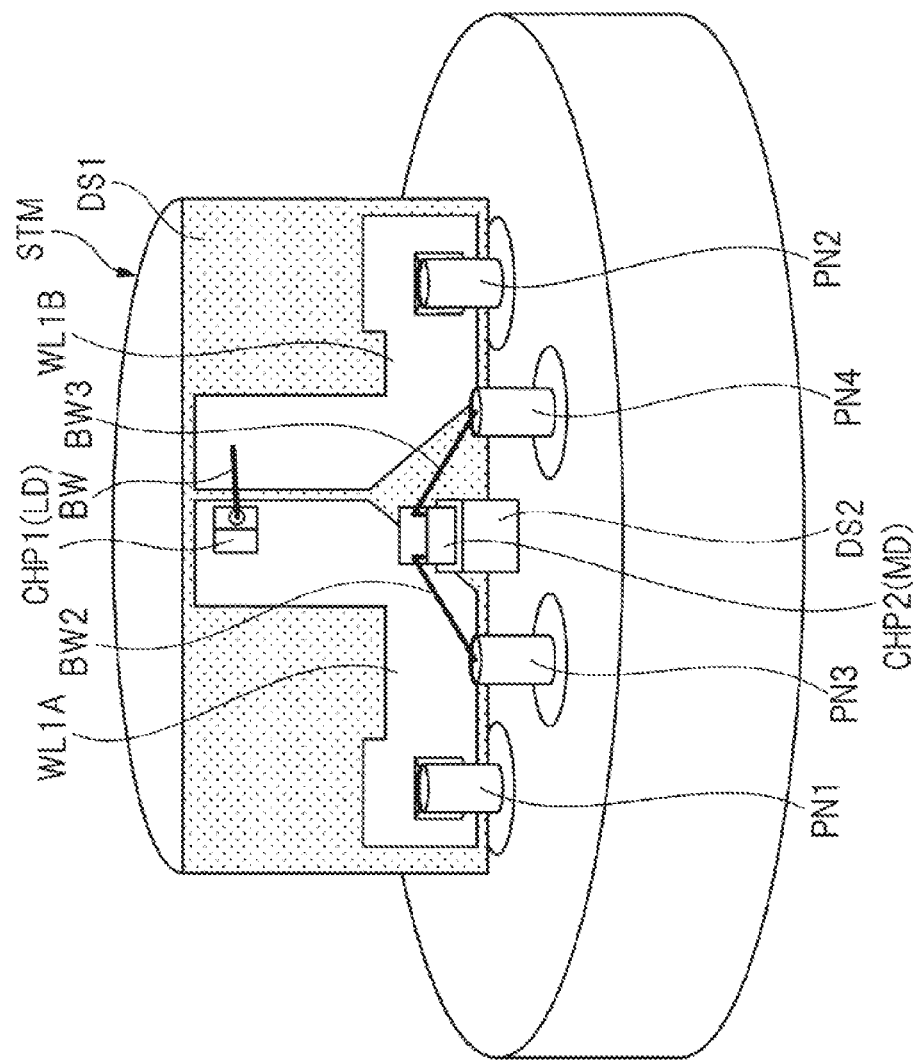
FIG. 22 is a schematic representation of a stem in a second embodiment.

Hereinafter, the configuration of a semiconductor device that embodies the basic idea of the second embodiment will be described. FIG. 22 is a diagram showing a schematic configuration of the stem STMs in the second embodiment. The stem STM in the second embodiment shown in FIG. 22 and the stem STM in the first embodiment shown in FIG. 16 have substantially the same configuration, and the main difference is the shapes of the wiring patterns of the wiring WL1A and the wiring patterns of the wiring WL1B formed on the surfaces of the dielectric substrate DS1. The main difference will be described with reference to FIG. 23 showing the plan view of the dielectric substrate DS1.

Figure 23:
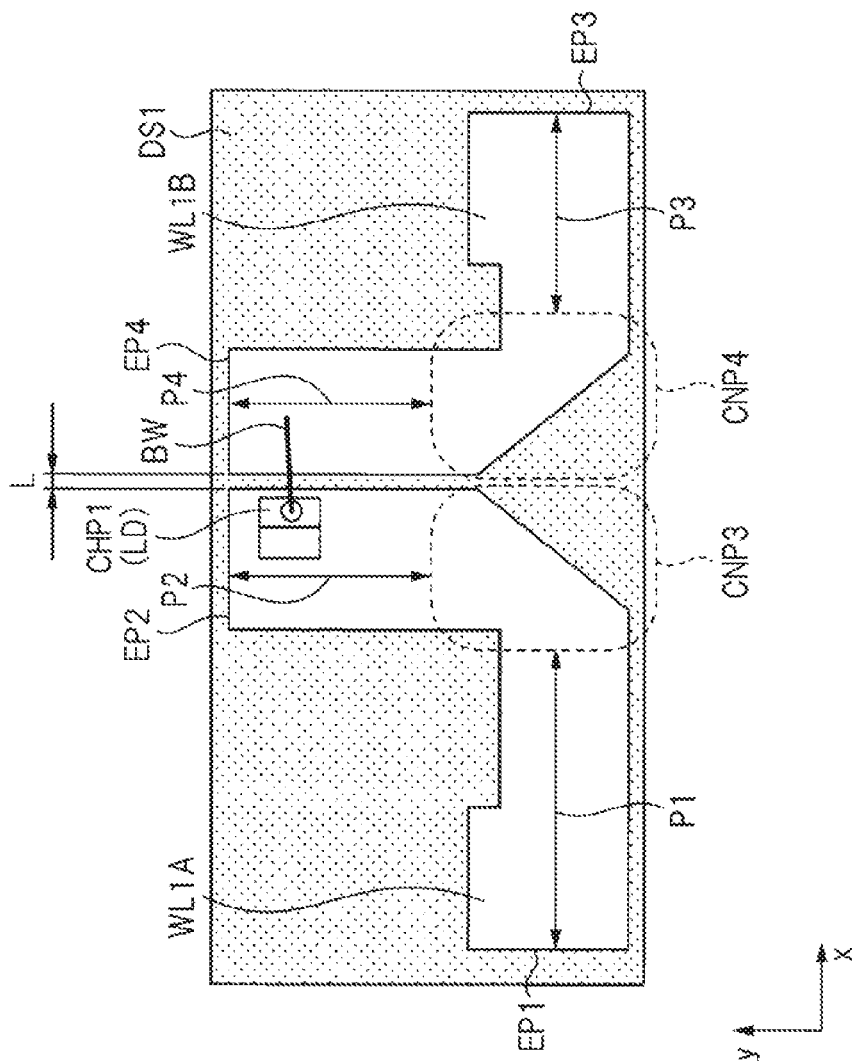
FIG. 23 is a plan view of the dielectric substrate in the second embodiment.

FIG. 23 is a plan view of the dielectric substrate DS1 in the second embodiment. In FIG. 23, a wiring WL1A and a wiring WL1B constituting a differential wiring are formed on surfaces of the dielectric substrate DS1. As shown in FIG. 23, a semiconductor chip CHP1 in which the semiconductor laser LD is formed is mounted on the wiring WL1A, and the semiconductor chip CHP1 is connected to the wiring WL1B via a conductive member typified by a bonding wire BW.

Here, as shown in FIG. 23, the wire WL1A has a first portion P1 extending in the x direction from the end EP1, a second portion P2 extending in the y direction from the other end EP2, and a corner portion CNP3 connected to each of the first portion P1 and the second portion P2. On the other hand, the wiring WL1B has a third portion P3 extending in the x direction from the end EP3, a fourth portion P4 extending in the y direction from the other end EP4, and a corner portion CNP4 connected to the third portion P3 and the fourth portion P4.

At this time, as shown in FIG. 23, the second portion P2 of the wiring WL1A and the fourth portion P4 of the wiring WL1B are arranged in parallel with each other, and the distance L between the second portion P2 of the wiring WL1A and the fourth portion P4 of the wiring WL1B is smaller than the distance between the first portion P1 of the wiring WL1A and the third portion P3 of the wiring WL1B. For example, the distance L between the second portion P2 of the wiring WL1A and the fourth portion P4 of the wiring WL1B is about the smallest processing dimension that can be realized by the patterning technique used for forming the wiring WL1A and the wiring WL1B.

In FIG. 23, the semiconductor chip CHP1 in which the semiconductor laser LD is formed is arranged on the second portion P2 at a position closer to the other end EP2 than the corner portion CNP3. In the wiring WL1B, the bonding wire BW is connected to a position closer to the other end EP4 than the corner portion CNP4.

Next, feature points in the second embodiment will be described. As shown in FIG. 23, for example, the characteristic point of the second embodiment is that the distance L between the second portion P2 of the wiring WL1A and the fourth portion P4 of the wiring WL1B which are parallel to each other is the smallest of the distances between the wiring WL1A and the wiring WL1B on the premise that the wiring WL1A and the wiring WL1B constitute the differential wiring. In other words, the second embodiment is characterized in that the distance between the second portion P2 on which the semiconductor chip CHP1 is mounted and the fourth portion P4 to which the bonding wire BW is connected is the smallest of the distance between the wiring WL1A and the wiring WL1B. Thus, according to the second embodiment, the differential impedance between the second portion P2 of the wiring WL1A and the fourth portion P4 of the wiring WL1B is smaller than the differential impedance between the first portion P1 of the wiring WL1A and the third portion P3 of the wiring WL1B.

Here, the second portion P2 of the wiring WL1A is closer to the semiconductor chip CHP1 than the first portion P1 of the wiring WL1A, and the fourth portion P4 of the wiring WL1B is closer to the connecting position of the bonding wire BW than the third portion P1 of the wiring WL1B.

Therefore, the differential impedance of the differential wirings (wiring WL1A and wiring WL1B) formed inside the stem STMs become smaller as the semiconductor chip approaches the semiconductor chip CHP1. This means that rapid discontinuities between the differential impedance of the differential wiring (wiring WL1A and wiring WL1B) and the characteristic impedance of the semiconductor chip CHP1 are alleviated. Therefore, considering the principle that the reflection loss of the high-frequency signal is reduced as the discontinuity of the characteristic impedance becomes gradual, the characteristic point in the second embodiment can reduce the reflection loss of the high-frequency signal.

Figure 24:
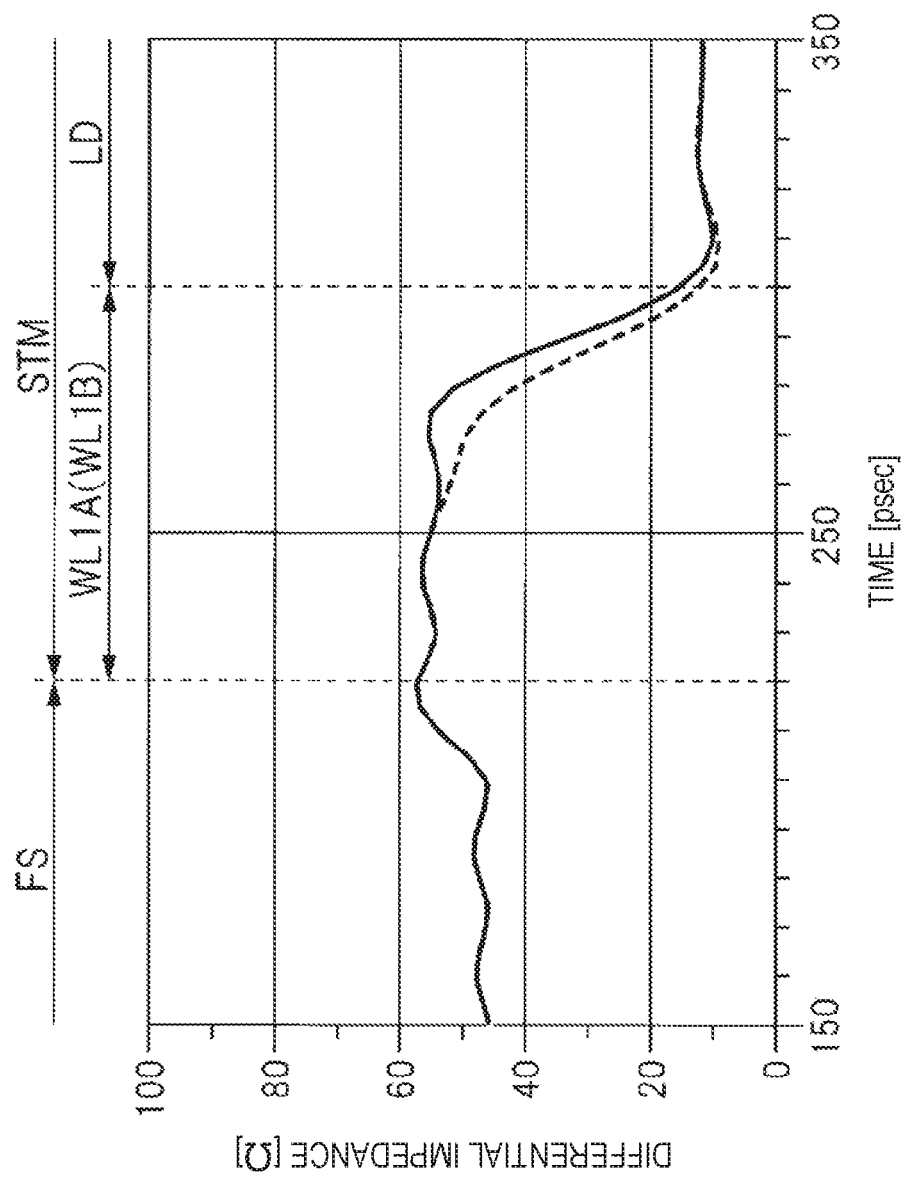
FIG. 24 is a graph showing a characteristic impedance of a semiconductor laser disposed within the stem, a differential impedance of a differential trace formed within the stem, and a differential impedance of a flexible substrate disposed outside the stem.

Specifically, FIG. 24 is a graph showing the characteristic impedance (differential impedance) of the semiconductor laser LD disposed inside the stem STM, the differential impedance of the differential wiring (wiring WL1A and wiring WL1B) formed inside the stem STM, and the differential impedance of the flexible substrate FS disposed outside the stem STM.

Here, the graph shown by the solid line in FIG. 24 is, for example, a graph for the differential wiring (wiring WL1A and wiring WL1B) in which the stub STB1 and the stub STB2 are deleted in FIG. 17. On the other hand, the graph shown by the broken line in FIG. 24 is a graph for the differential wiring (wiring WL1A and wiring WL1B) having the configuration in the second embodiment shown in FIG. 23.

It can be seen from both the solid line in FIG. 24 and the broken line in FIG. 24 that the differential impedance of the flexible substrate FS is substantially the same at about 50Ω, and the characteristic impedance (differential impedance) of the semiconductor laser LD is substantially the same at about 10Ω. On the other hand, by having the characteristic point in the second embodiment in which the distance of the differential wirings which are located at a position in the vicinity of the semiconductor chip is reduced, it can be seen that the change of the differential impedance of the differential wirings (wiring WL1A and wiring WL1B) formed inside the stem STM in the graph shown by the broken line in FIG. 24 is more gradually changed than the change of the differential impedance of the differential wirings (wiring WL1A and wiring WL1B) formed inside the stem STM in the graph shown by the solid line in FIG. 24. That is, from FIG. 24, by applying the characteristic point in the second embodiment of reducing the distance of the differential wirings which are located at a position in the vicinity of the semiconductor chip to the differential wirings (wiring WL1A and wiring WL1B) formed inside the stem STMs, it is confirmed that the abrupt discontinuity between the differential impedance of the differential wirings and the characteristic impedance of the semiconductor laser is alleviated.

Figure 25:
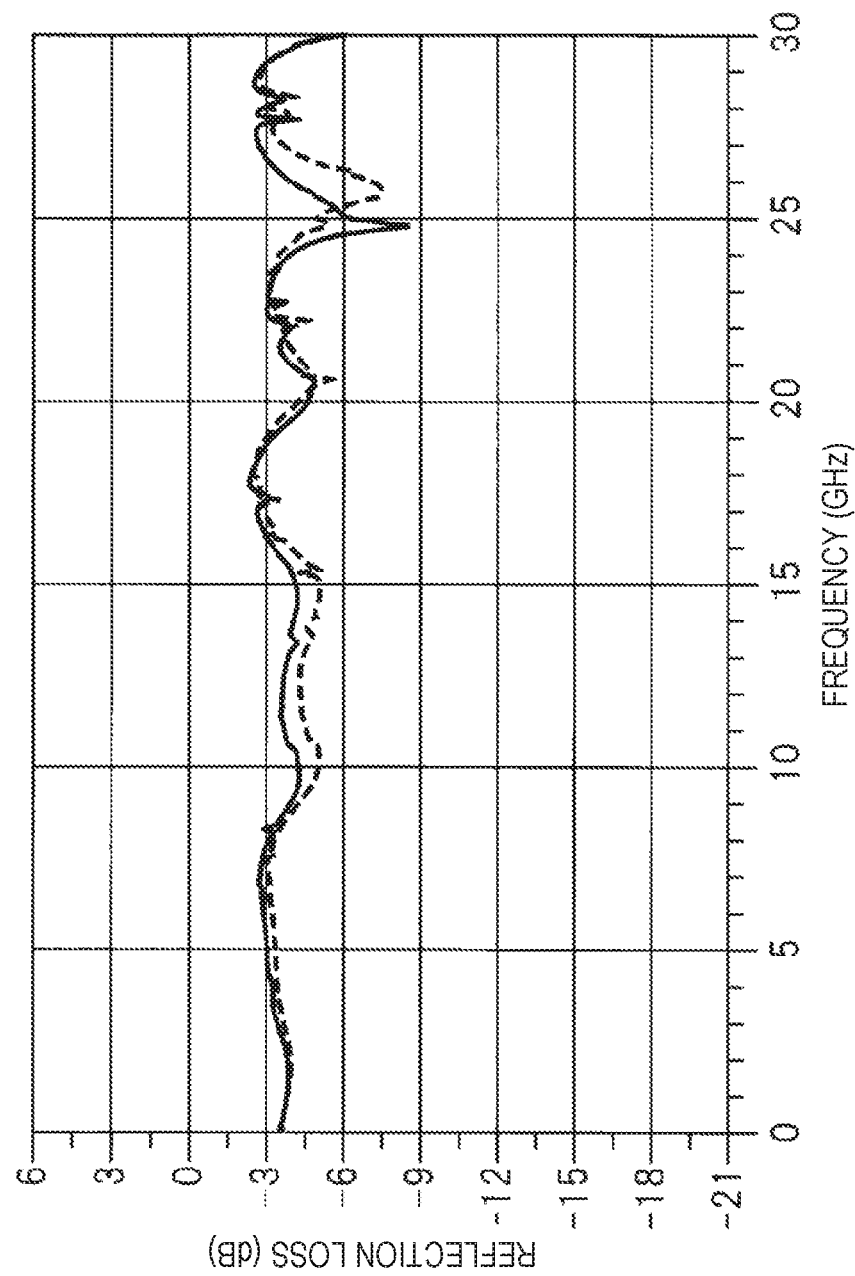
FIG. 25 is a graph showing the frequency dependence of the reflection loss.

FIG. 25 is a graph showing the frequency dependence of the reflection loss. In FIG. 25, the horizontal axis represents frequency (GHz), and the vertical axis represents reflection loss (dB). Here, the solid line in FIG. 25 shows a graph of a related technique (in FIG. 17, a technique employing differential wiring (wiring WL1A and wiring WL1B) in which the stub STB1 and the stub STB2 are deleted) that does not have a characteristic point in the second embodiment, while the broken line in FIG. 25 shows a graph of the second embodiment. As shown in FIG. 25, in the graph (broken line in FIG. 25) showing the frequency characteristics of the second embodiment, it can be seen that the reflectance losses are reduced in the 10 GHz to 15 GHz band as compared with the graph (solid line in FIG. 25) showing the frequency characteristics of the related art.

Figure 26:
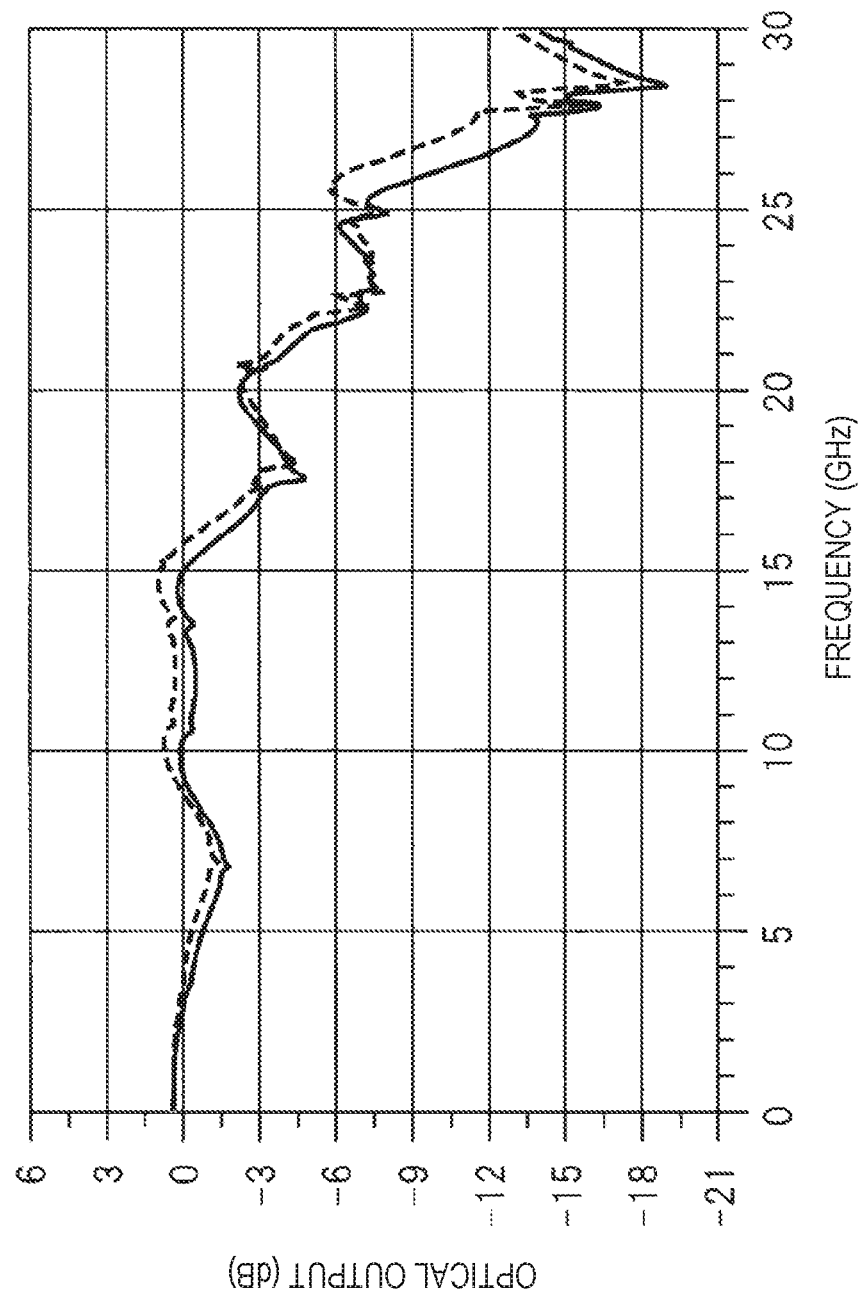
FIG. 26 is a graph showing the frequency characteristics of the optical output from a semiconductor laser.

FIG. 26 is a graph showing the frequency characteristic of the light output from the semiconductor laser. In FIG. 26, the horizontal axis represents frequency (GHz), and the vertical axis represents optical output (dB). Here, the solid line in FIG. 26 shows a graph of a related technique (a technique employing differential wiring (wiring WL1A and wiring WL1B) in which the stub STB1 and the stub STB2 are deleted in FIG. 17) that does not have a characteristic point in the second embodiment, while the broken line in FIG. 26 shows a graph of the second embodiment.

As shown in FIG. 26, in the graph (broken line in FIG. 26) showing the frequency characteristic of the second embodiment, it can be seen that the light output in the second embodiment is higher than the light output in the related art as compared with the graph (solid line in FIG. 26) showing the frequency characteristic of the related art. Further, as shown in FIG. 26, it can be seen that in the second embodiment, "peaking" occurs in which the optical power is higher than 0 dB in the 10 GHz to 15 GHz band. This means that, as a result of the reduction of the reflection loss, the high-frequency signal (driving current) flowing into the semiconductor chip in which the semiconductor lasers are formed increases due to the characteristic feature of the second embodiment, and it indicates that the optical power from the semiconductor lasers increases if the reflection loss of the high-frequency signal is reduced.

Third Embodiment

In the third embodiment, combinations of the technical idea in the first embodiment and the technical idea in the second embodiment will be described. That is, in the third embodiment, a technical idea of suppressing reflectives caused by the mismatch of the characteristic impedance between the transmission line and the semiconductor laser at a particular frequency by providing shunt capacitors called stubs in the vicinity of the mounting area of the semiconductor chip in which the semiconductor laser is formed and reducing the distance of the differential wirings at positions close to the semiconductor chip will be described.

Structure of Semiconductor Device

Figure 27:
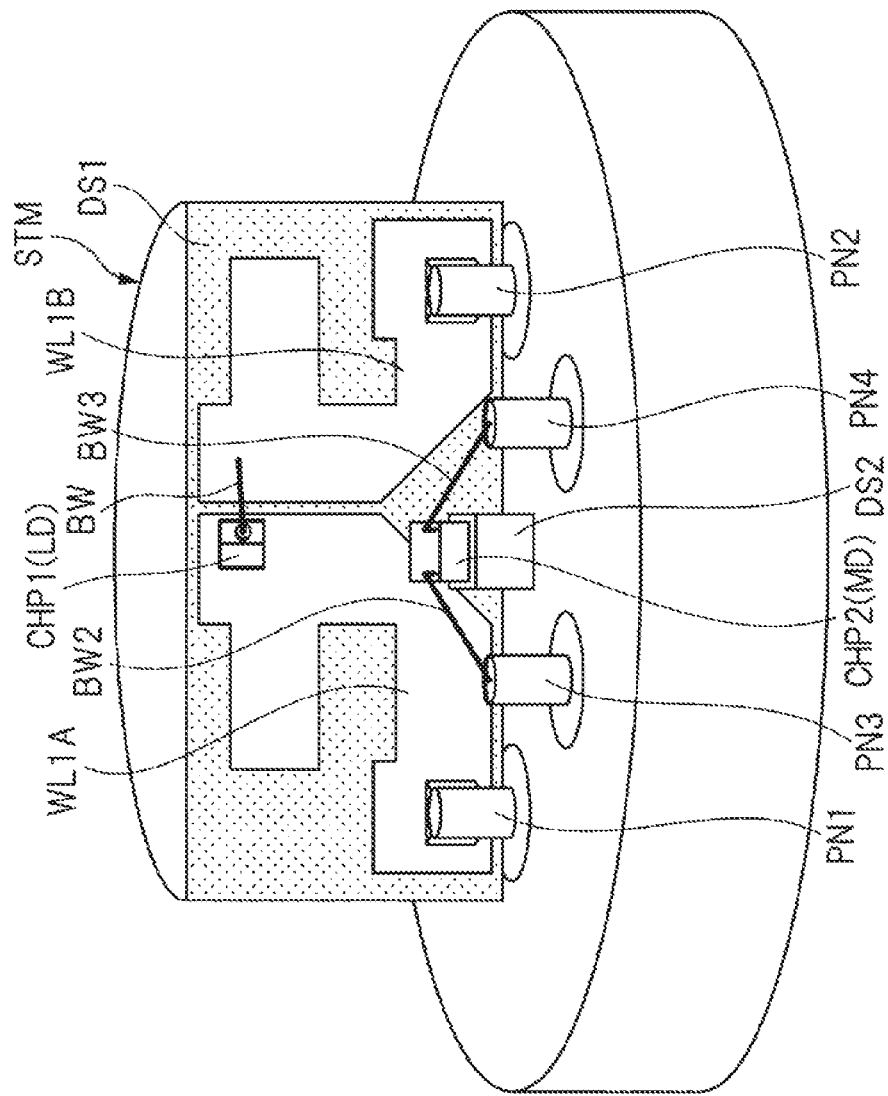
FIG. 27 is a schematic representation of a stem in a third embodiment.

FIG. 27 is a diagram illustrating a schematic configuration of a stem STM in the third embodiment. The stem STM in the third embodiment shown in FIG. 27 and the stem STM in the first embodiment shown in FIG. 16 have substantially the same configuration, and the main difference is the shapes of the wiring patterns of the wiring WL1A and the wiring patterns of the wiring WL1B formed on the surfaces of the dielectric substrate DS1. Therefore, this main difference will be explained based on FIG. 28 showing the plan view of the dielectric substrate DS1.

Figure 28:
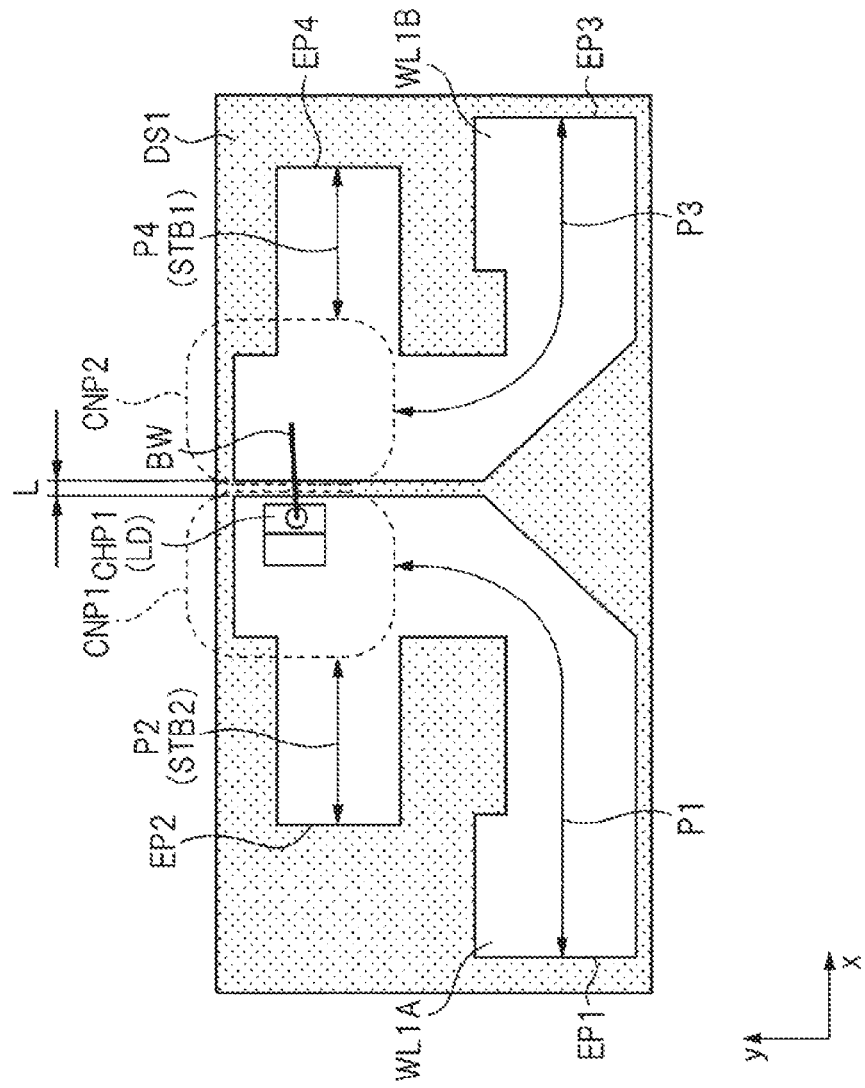
FIG. 28 is a plan view of the dielectric substrate.

FIG. 28 is a plan view of the dielectric substrate DS1. In FIG. 28, a wiring WL1A and a wiring WL1B constituting a differential wiring are formed on surfaces of the dielectric substrate DS1. The wiring WL1A has a first portion P1 extended from the end portion EP1, a second portion P2 extended from the other end portion EP2, and a corner portion CNP1 connected to the first portion P1 and the second portion P2. Here, the first portion P1 of the wiring WL1A functions as a wiring through which high-frequency signals propagate, while the second portion P2 of the wiring WL1A functions as a stub STB2 contributing to increasing the parasitic capacitance. As described above, the second portion P2 of the wiring WL1A constitutes a stub STB2 serving as a shunting capacitor for alleviating the mismatch between the characteristic impedance of the semiconductor laser and the characteristic impedance of the differential wiring, i.e., the wiring WL1A and the wiring WL1B of the semiconductor laser.

Subsequently, the wiring WL1B has a third portion P3 extended from the end EP3, a fourth portion P4 extended from the other end EP4, and a corner portion CNP2 connected to the third portion P3 and the fourth portion P4. Here, the third portion P3 of the wiring WL1B functions as a wiring through which high-frequency signals propagate, while the fourth portion P4 of the wiring WL1B functions as a stub STB1 contributing to increasing the parasitic capacitance. As described above, the fourth portion P4 of the wiring WL1B constitutes a stub STB1 serving as a shunting capacitor for alleviating the mismatch between the characteristic impedance of the semiconductor laser and the characteristic impedance of the differential wiring, i.e., the wiring WL1A and the wiring WL1B of the semiconductor laser.

In the third embodiment, the second portion P2, which is a stub STB2, can be expressed as a first protrusion protruding away from the fourth portion P4. Similarly, the fourth portion P4, which is a stub STB1, can also be referred to as a second protrusion that protrudes away from the second portion P2.

Further, in FIG. 28, in the semiconductor device in the third embodiment, the first portion P1 of the wiring WL1A and the third portion P3 of the wiring WL1B have portions that are parallel to each other. At this time, as shown in FIG. 28, the distance L between the first portion P1 and the third portion P3 in the mutually parallel portions is smaller than the distance between the first portion P1 and the third portion P3 in the other portions. The corner portion CNP1 connected to the first portion P1 and the corner portion CNP2 connected to the third portion P3 are disposed so as to face each other, and the distance between the corner portion CNP1 and the corner portion CNP2 is the same as the distance L. In particular, the distance L is about the smallest processing dimension that can be realized by the patterning technique used in forming the wiring WL1A and the wiring WL1B, similarly to the distance second embodiment.

In this manner, in the semiconductor device according to the third embodiment, a combination of the above-mentioned first embodiment form in which a shunting capacitor called a stub STB2 (STB1 is provided in the vicinity of the mounting region (mounting region) of the semiconductor chip CHP1 and the above-mentioned mentioned second embodiment configuration in which the distance (distance L) of the differential wirings at the position close to the semiconductor chip CHP is reduced is realized.

Effect in Third Embodiment

Figure 29:
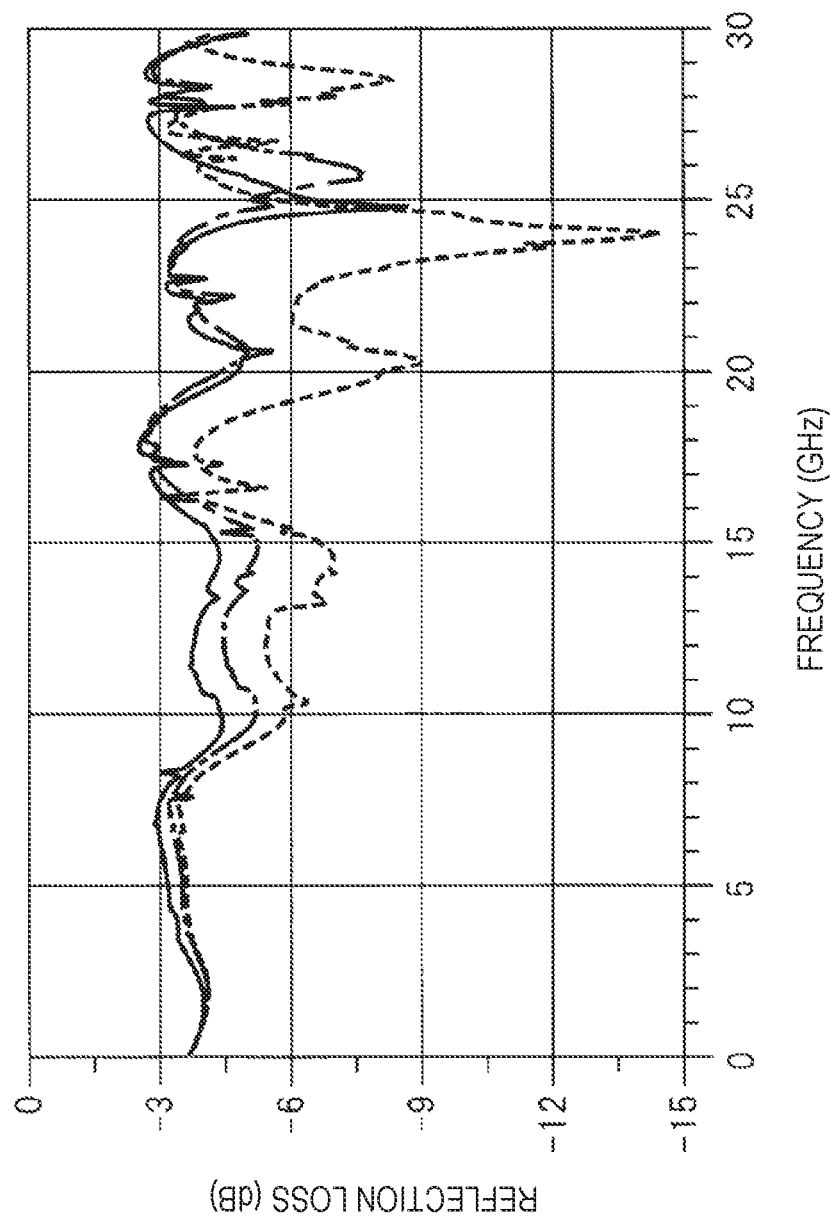
FIG. 29 is a graph showing the frequency dependence of the reflection loss.

FIG. 29 is a graph illustrating the frequency-dependence of reflective losses. In FIG. 29, the horizontal axis represents frequency (GHz), and the vertical axis represents reflection loss (dB). Here, the solid line in FIG. 29 shows graphs of the related art (the technique employing the differential wiring (wiring WL1A and wiring WL1B) in which the stub STB1 and the stub STB2 are deleted in FIG. 17). On the other hand, the dashed line in FIG. 29 shows the graph of the second embodiment, and the dashed line in FIG. 25 shows the graph of the third embodiment. As shown in FIG. 29, in the graph (broken line in FIG. 29) showing the frequency characteristic of the third embodiment, it can be seen that the reflection loss is reduced as compared with the graph (solid line in FIG. 29) showing the frequency characteristic of the related art or the graph (dashed line in FIG. 29) showing the frequency dependency of the second embodiment. That is, in the third embodiment, since the feature point in the first embodiment and the feature point in the second embodiment are provided together, the synergistic effects caused by these feature points can greatly reduce the reflective losses.

Figure 30:
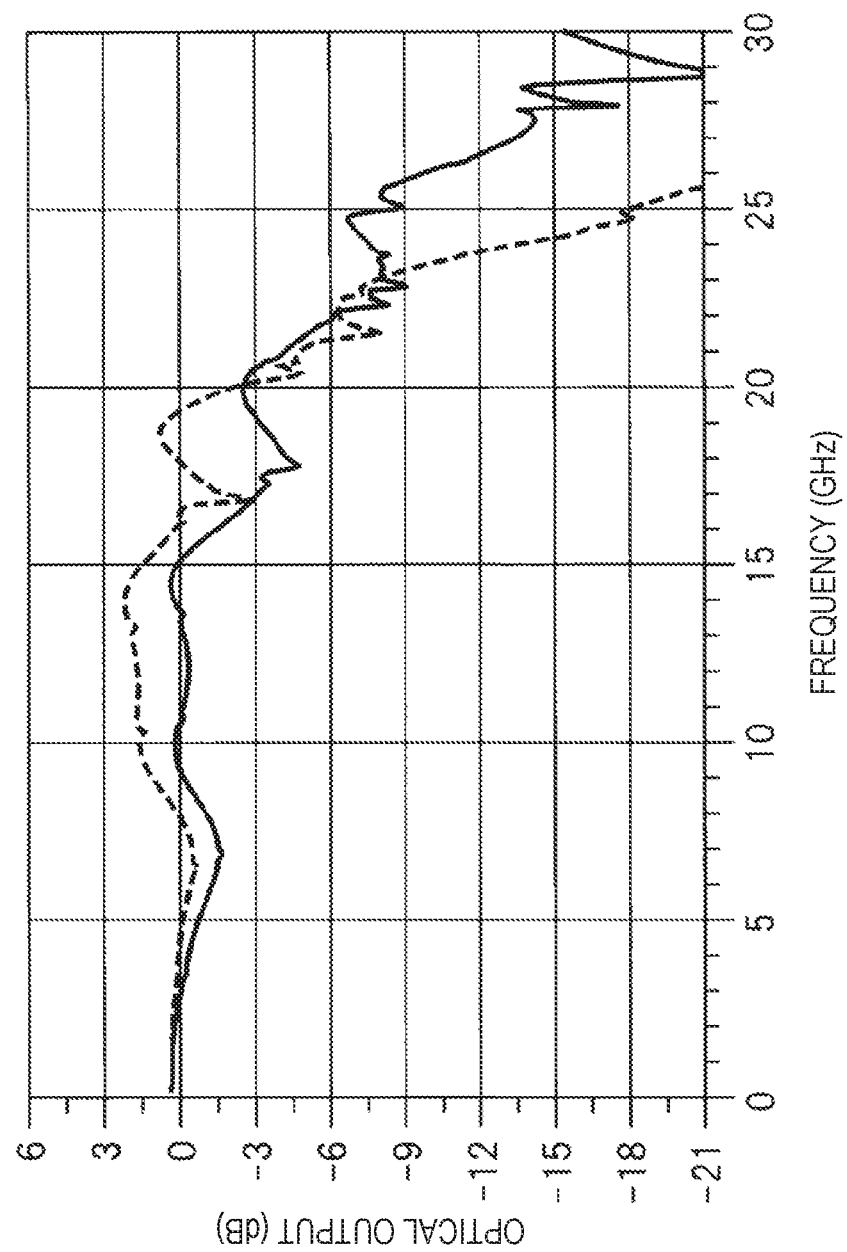
FIG. 30 is a graph showing the frequency characteristics of the optical output from a semiconductor laser.

FIG. 30 is a graph showing the frequency characteristic of the light output from the semiconductor laser. In FIG. 30, the horizontal axis represents frequency (GHz), and the vertical axis represents optical output (dB). Here, the solid line in FIG. 30 shows graphs of the related art (the technique employing the differential wiring (wiring WL1A and wiring WL1B) in which the stub STB1 and the stub STB2 are deleted in FIG. 17). On the other hand, the dashed line in FIG. 30 shows the graphs of the third embodiment. As shown in FIG. 30, in the graph (broken line in FIG. 30) showing the frequency characteristic of the third embodiment, it can be seen that the light output in the third embodiment is higher than the light output in the related art as compared with the graph (solid line in FIG. 30) showing the frequency characteristic of the related art. Further, as shown in FIG. 30, it can be seen that in the third embodiment, "peaking" occurs in which the optical power is higher than 0 dB in the vicinity of the band of 8 GHz to 17 GHz. From the above, according to the semiconductor device in the third embodiment, the combination of the first embodiment and the second embodiment can cause a significant increase in the optical power due to "peaking" through a further significant decrease in the reflection loss at a particular frequency, thereby obtaining a remarkable effect that the data rate of the optical transceiver in the DMT system can be further increased.

The invention made by the present inventor has been described above in detail based on the embodiment, but the present invention is not limited to the embodiment described above, and it is needless to say that various modifications can be made without departing from the gist thereof.

What is claimed is:
1. A semiconductor device, comprising:
   a semiconductor chip in which a semiconductor laser is formed; and
   a first wiring electrically connected with the semiconductor chip,
   wherein the first wiring has:
     a first portion extended from a first one end portion,
     a second portion extended from a first other end portion, and
     a first corner portion connected to each of the first portion and the second portion, and
   wherein the semiconductor chip is mounted on the first corner portion.
2. The semiconductor device according to claim 1, wherein the second portion is a stub.
3. The semiconductor device according to claim 1, wherein a length of the second portion is shorter than a length of the first portion.

4. The semiconductor device according to claim 1,
wherein the first one end portion is electrically connected with a transmission line intervening between a driver circuit driving the semiconductor laser and the semiconductor device, and
wherein the second portion contributes to the increase of parasitic capacitance.

5. The semiconductor device according to claim 4,
wherein the second portion has a function for reducing the mismatch between a characteristic impedance of the semiconductor laser and a characteristic impedance of the first wiring.

6. The semiconductor device according to claim 1 further comprising:
a second wiring constituting a differential wiring by paring with the first wiring,
wherein the second wiring has:
a third portion extended from a second one end portion,
a fourth portion extended from a second other end portion, and
a second corner portion connected to each of the third portion and the fourth portion, and
wherein the semiconductor chip and the second corner portion are electrically connected with each other via a conductive material.

7. The semiconductor device according to claim 6,
wherein the conductive material is a wire.

8. The semiconductor device according to claim 6,
wherein the first corner portion and the second corner portion are faced to each other.

9. The semiconductor device according to claim 6,
wherein the second portion and the fourth portion are paralleled to each other.

10. The semiconductor device according to claim 6,
wherein the first portion and the third portion have portions, which are paralleled to each other, and
wherein a distance between the portions of the first and third portions, which are faced to each other, is shorter than a distance between the other portions of the first and third portions, which are except for the portions of the first and third portions.

11. The semiconductor device according to claim 10,
wherein the distance between the portions of the first and third portions, which are faced to each other, is a minimum processing dimension of each of the first wiring and the second wiring.

12. A semiconductor device, comprising:
a semiconductor chip in which a semiconductor laser is formed;
a first wiring electrically connected with the semiconductor chip; and
a second wiring electrically connected with the semiconductor chip via a conductive material,
wherein the first wiring has:
a first portion extended from a first one end portion,
a second portion extended from a first other end portion, and
a first corner portion connected to each of the first portion and the second portion,
wherein the second wiring has:
a third portion extended from a second one end portion,
a fourth portion extended from a second other end portion, and
a second corner portion connected to each of the third portion and the fourth portion,
wherein the second portion and the fourth portion are comprised of portions, respectively, which are paralleled to each other,
wherein, in the second portion, the semiconductor chip is located at a region closer to the first other end portion than the first corner portion, and
wherein, in the fourth portion, the conductive material is connected to a region closer to the second other end portion than the second corner portion.

13. The semiconductor device according to claim 12,
wherein a distance between the portions of the second and fourth portions, which are faced to each other, is a minimum processing dimension of each of the first wiring and the second wiring.

14. The semiconductor device according to claim 12,
wherein the second portion has a first protruding portion protruded in a direction away from the fourth portion, and
wherein the fourth portion has a second protruding portion protruded in a direction away from the second portion.

15. The semiconductor device according to claim 14,
wherein each of the first protruding portion and the second protruding portion is a stub.

* * * * *